United States Patent [19]
Yagi et al.

[11] Patent Number: 5,344,522
[45] Date of Patent: Sep. 6, 1994

[54] PATTERN FORMING PROCESS AND PROCESS FOR PREPARING SEMICONDUCTOR DEVICE UTILIZING SAID PATTERN FORMING PROCESS

[75] Inventors: Takayuki Yagi, Machida; Toshiyuki Komatsu, Hiratsuka; Yasue Sato, Kawasaki; Shinichi Kawate, Machida, all of Japan

[73] Assignee: Canon Kabushiki Kaisha, Tokyo, Japan

[21] Appl. No.: 13,180

[22] Filed: Jan. 29, 1993

Related U.S. Application Data

[63] Continuation of Ser. No. 696,024, May 6, 1991, abandoned.

[30] Foreign Application Priority Data

| May 9, 1990 | [JP] | Japan | 2-117644 |
| May 10, 1990 | [JP] | Japan | 2-118675 |
| Jun. 19, 1990 | [JP] | Japan | 2-158687 |
| Jul. 3, 1990 | [JP] | Japan | 2-174443 |
| Nov. 16, 1990 | [JP] | Japan | 2-308550 |

[51] Int. Cl.$^5$ .................. H01L 21/306; B44C 1/22; C23F 1/00
[52] U.S. Cl. .................. 156/628; 156/643; 156/656; 156/657; 156/662; 156/659.1; 156/345
[58] Field of Search ............. 156/628, 643, 646, 653, 156/654, 655, 656, 657, 659.1, 662, 345, 904; 134/1; 427/534, 558, 572, 582

[56] References Cited

U.S. PATENT DOCUMENTS

| 3,326,717 | 6/1967 | Gregor et al. | 117/212 |
| 3,346,384 | 10/1967 | Gaynor | 156/643 X |
| 4,698,238 | 10/1987 | Hayasaka et al. | 427/53.1 |
| 4,761,199 | 8/1988 | Sato | 156/345 |
| 4,960,675 | 10/1990 | Tsuo et al. | 430/311 |
| 5,024,716 | 6/1991 | Sato | 156/345 |
| 5,024,724 | 6/1991 | Hirono et al. | 156/643 |

FOREIGN PATENT DOCUMENTS

| 0162717 | 11/1985 | European Pat. Off. . |
| 0178654 | 4/1986 | European Pat. Off. . |
| 0203563 | 12/1986 | European Pat. Off. . |
| 0265658 | 5/1988 | European Pat. Off. . |
| 0273392 | 7/1988 | European Pat. Off. . |
| 0339771 | 11/1989 | European Pat. Off. . |
| 3628374 | 2/1988 | Fed. Rep. of Germany . |
| 1389506 | 1/1965 | France . |
| 62-219525 | 9/1987 | Japan . |
| 2094720 | 9/1982 | United Kingdom . |

OTHER PUBLICATIONS

Sesselmann, et al., "Chlorine Surface Interaction and Laser–Induced Surface Etching Reactions," J. Vac. Sci. Tech. B3(5), Sep. 1985, pp. 1507–1512.

Taneya, et al., "Photo–Oxidation of GaAs For In Situ Patterned–Mask Formation Prior to Chlorine Gas Etching," Appl. Phys. Lett., vol. 56, No. 1, Jan. 1990, pp. 98–100.

Judge, et al., "Antireflective Chrome Photomasks," IBM Technical Disclosure Bulletin, vol. 13, No. 3, Aug. 1970.

Stetson, "Producing Reduced Reflectivity Master Mask on Working Plate," IBM Technical Disclosure Bulletin, vol. 18, No. 10, Mar. 1976.

Oehrlein, et al., "Plasma–Deposited Fluorocarbon Films on Silicon Studied By Ellipsometry," 2194 Thin Solid Films, vol. 143, No. 3, Oct. 1986, pp. 269–278.

Patent Abstracts of Japan, Kokai No. 62-217245, vol. 12, No. 79, Mar. 1988.

Patent Abstracts of Japan, Kokai No. 63-204259, vol. 12, No. 492, Dec. 1988.

*Primary Examiner*—William Powell
*Attorney, Agent, or Firm*—Fitzpatrick, Cella, Harper & Scinto

[57] ABSTRACT

A process for forming an etching pattern, which includes selectively irradiating a light to a clean surface of a material to be worked by etching so as to form radicals from a photoradical forming substance in an atmosphere of the substance, forming a modified portion having an etching resistance at a photo-irradiated portion of the surface, and then subjecting an unmodified portion of the surface of the material to be worked to an etching treatment, thereby forming an etching pattern corresponding to a pattern formed by the irradiation.

49 Claims, 14 Drawing Sheets

PATTERN FORMING PROCESS AND PROCESS FOR PREPARING SEMICONDUCTOR DEVICE UTILIZING SAID PATTERN FORMING PROCESS

This application is a continuation of prior application Ser. No. 07/696,024 filed May 6, 1991, now abandoned.

BACKGROUND OF THE INVENTION

1. Field of the Invention

This invention relates to a pattern forming process, an apparatus for preparing the pattern and a process for preparing a semiconductor device utilizing the pattern forming process, more particularly to a process for forming a pattern by etching, etc. of a material to be worked of a semiconductor, a metal, an insulator, etc., particularly to a process forming an etching pattern suitable for a pattern formation by a fine etching, etc. such as pattern formation of an electronic device, etc., an apparatus for forming the pattern and a process for preparing a semiconductor device utilizing the pattern forming process.

2. Related Background Art

In recent years, with the enlargement of an aperture of an exposure device to be utilized in a pattern forming technique utilizing photolithographic techniques, a large area device which is seen in a flat panel such as an active matrix liquid crystal display, a direct current plasma display, etc. is going to be commercially produced.

The pattern forming process utilizing photolithography to be used for the formation of various patterns which these device have includes the steps of coating the predetermined surface of a material to be worked with a photoresist, subjecting the photoresist to treatments including pattern exposure, development to form a resist pattern, and affecting an etching by using a solvent or utilizing a physical or chemical reaction in gas phase while using the resist pattern as a mask.

Whereas, in the case of a VLSI chip, since the chip is formed by preparing some ten or more chips on one wafer at the same time under an integrated state and cutting it by dicing, it is possible to select and exclude the defective chips on one wafer. In contrast, in the case of a large area device, the number of the chips taken out from one wafer is no more than 1 to several. Only by modifying the device design such as reduction of the total number of the resist masks necessary for pattern formation utilizing photolithography, optimization of the design rule, etc., it is difficult to improve a yield which is one of the primary factors for determining the device cost.

Thus, in the preparation steps of semiconductor devices, the photolithographic process of forming a device structure by applying a fine working to a sample substrate according to a desired pattern is one of important techniques. As described above, in the photolithographic process, complicated and cumbersome processes such as resist coating, pattern exposure, developing, etching, resist peel-off, etc. have been generally employed.

And, as described above, as represented by a semiconductor memory device in recent years, an enhancement of capacity and performance of the device have been rapidly progressed, whereby the circuit pattern is becoming finer and also the circuit structure further complicated. On the other hand, the display device such as a liquid crystal display, plasma display, etc. becomes increasingly enlarged, and also the device functions are going to be more complicated. Accordingly, when these devices are to be prepared according to the process as described above, due the more complicated process itself, the cost will be increased. Further, due to generation of dust, etc., the yield will be lowered. Also the cost will be increased as a whole.

As attempts for accomplishing a high yield in the pattern formation utilizing photolithography, two methods have been investigated.

Since a defect generation depends on the environment in the lines of film formation and pattern formation, one method is to effect a cleaning of the working steps in these lines.

The ultra-cleaning technique (see Nikkei Microdevice, Extra Vol. No. 2, October, 1986) has enabled the reduction of a defective generation density by two orders or less as compared with the prior art.

However, when these methods are employed, a great installation investment for auxiliary equipments, automatic conveying apparatus, etc. for holding the standards with respect to purity of pure water, gases, etc. to be used at an extremely high level is required.

The other method is a method to add the defect correcting step to the fine working process so as to provide a redundant circuit in the device (Branch of Society of Applied Electronic Physical Properties, Research Report No. 427, p. 13).

Whereas, in this method, the process of photolithography becomes complicated, and also the problem remains that the cost and time required for inspection and correction increase.

In view of the state of the pattern formation technique utilizing photolithography as described above, it has been attempted to develop pattern formation techniques without using photolithography.

As one of them, there have been proposed the method utilizing the optical process (see "Examination Research Report Concerning New Electronic Materials XIII" 62-M-273, Society of Electronic Industry Promotion of Japan). Particularly, a photoetching is a process which effects an etching at the photoirradiated portion by a site selective photoirradiation to a material to be worked in the vacuum capable of maintaining a clean environment. None of the steps of the coating of the resist pattern, the pattern exposure, or the developing are utilized. Thereby, a high yield can be expected, there is little ionic shock, and also a great cost-down is possible by reducing reducting the materials cost necessary for formating the resist pattern in photolithography. Thus, this process attracts attention as an ideal pattern forming process.

As one example of the photoetching processes, there has been known a process in which, by selectively irradiating an excimer laser to a polycrystalline silicon substrate added with phosphorus in an atmosphere where chlorine gas and methyl methacrylate are permitted to coexist, a polymerized film at the non-irradiated portion and the portion irradiated with a small irradiation dose is formed, while the polymerized film is not formed at the portion irradiated with a large irradiation dose, and then the substrate is etched by chlorine radicals to form a pattern (SEMI Technol. Symp. 1985, P. F-3-1).

Further, a photoetching technique which performs the formation of a pattern shortening the cumbersome process to a great extent in place of the photolithographic process by use of the resist as described above is also described in Sekine, Okano, Hottike: The Fifth Dry Process Symposium Lecture Pretext, p. 97 (1983). In this essay, there is reported the process in which a substrate deposited with a polysilicon (p-Si) film thereon is set within the reaction chamber where chlorine gas is introduced, a UV-ray is selectively irradiated through a photomask to the Si substrate by setting the photomask having a light shielding pattern in parallel to the substrate surface, whereby an etching proceeds only at the region where the UV-ray is irradiated to form a pattern on the p-Si film. By use of the phototreatment apparatus utilizing the process, the steps of resist coating, developing, resist peel-off, etc. can be obviated to simplify the steps, improve the yield and reduce the cost to a great extent. Further, etching without the generation of damage by ion irradiation which is a problem in the reactive ion etching of the prior art is rendered possible.

Nevertheless, the photoetching process as described above still has various problems to be solved.

For example, as compared with the electron impingement dissociation area of the molecules in the plasma in the dry etching of the prior art, the light absorbing sectional area of the molecules by photons is smaller by about 1 to 2 orders, and therefore the amount of the radicals which are reactive molecules or atoms having effective non-bonding arms necessary for etching is small. For this reason, it is required to increase the irradiation dose.

However, by the photoirradiation apparatus presently available, a sufficiently satisfactory irradiation dose cannot be obtained, and photoirradiation for a long time will be required.

For example, J. Vac. Sci. Technol., B3 (5), 1507 (1985) discloses the acceleration of etching by use of an excimer laser which is a large output laser. But the irradiation area in this method is about some ten mm square. For example, when the treatment area is about A4 size, the time required for the etching treatment will be one hour or more.

For obtaining a sufficient irradiation dose in the photoetching, the realization of enlarging a laser aperture and a laser output must be awaited, and it is difficult under the present situation to apply photoetching to the fine working process for the sheet system high speed etching accompanied with the enlargement of the device.

As a process for improving such problems in the photoetching, the process in which a high speed etching is performed by combining the photoetching with the plasma etching has been proposed.

This process comprises selectively irradiating an excimer laser to the surface of a material to be worked by etching while decomposing a gas of a hydrocarbon compound of which a part or all of the hydrogens is substituted with halogen atoms to deposit a polymerized film thereon, decomposing and removing the polymerized film at the photoirradiated portion, and further etching the surface of the material to be worked consequently exposed by halogen atom radicals, thereby obtaining an etching pattern corresponding to the photoirradiated pattern (Japanese Laid-open Patent Application No. 62-219525).

However, even in such a process, the photoirradiated area is as narrow as several ten mm square, and the etching speed is about some 1000 Å/min, the improvement of one order or more as compared with the photoetching as described above is not desired, and it could be unsatisfactory to apply to the fine working process for a sheet system high speed etching accompanied with the enlargement of the device.

Further, according to such a process, there is also the problem that the material to be worked may be damaged by the shock of halogen element radicals against the material to be worked.

Further, in the phototreatment apparatus as described above, when the photoetching is carried by selectively varying light intensities, it is necessary to perform the photoetching at plural times by exchanging the photomask to be used. As an example, the steps when preparing an Si image sensor constituted of laminated films is explained below.

For the laminated product having a Cr electrode 162, an SiN film 163, an Si film 164, an $n^+$-Si film 165 and an Al electrode 166 on a glass substrate 161 as shown in FIG. 1, it is necessary to have the first step of removing the unnecessary portion of the ohmic layer ($n^+$-Si film 165) during a channel formation to make it the state as shown in FIG. 2, and the second step of removing the unnecessary portions of a semiconductor layer (SiN film 163, Si film 164 and $n^+$-Si film 165) to form the state as shown in FIG. 3. In these respective steps, it is necessary to carry out the photoetching by use of photomasks having patterns different from one another.

Accordingly, in the phototreatment apparatus of the prior art as described above, when selectively performing the photoetching with different intensities, there is the problem that a phototreatment etching is required to be performed by exchanging the photomask every time, whereby the preparation steps are complicated.

In addition, in the pattern forming apparatus by use of the selectively irradiated light by the above-mentioned photoetching technique, a part of UV-ray light transmitted through the photomask is reflected at the surface of a sample substrate, and further a part of the reflected light is reflected at a light-shielding pattern surface of the photomask to be returned to the above sample substrate and to irradiate a non-irradiated region of the sample substrate, whereby there is the problem that the predetermined pattern cannot be often formed with a good precision on the sample substrate.

As described above, the main preparation steps of semiconductor devices are the steps of forming a film of metal, semiconductor or insulator on the substrate and fine working the film to a desired pattern. Presently, in the film forming step and the etching step of performing the fine working for the preparation of these semiconductor devices, the main step comprises, rather than the step using a solution, the so-called dry step using a plasma or excited gas in vacuum or reduced pressure gas. However, for carrying out a desired fine working, in the photolithographic process generally employed, as described above, the complicated processes such as resist coating, pattern exposure, development, etching, resist peel-off, etc. have been employed. However, since a solution is used in the resist coating, developing, resist peel-off steps, all the steps cannot be made a dry step.

Since in the semiconductor preparation steps as described above the steps of performing in vacuum, in solution and in air are mixed therein, the surface of the samples will be oxidized and also the preliminary steps for the subsequent steps are required (e.g. steps of vacuuming for making the sample under a reduced state, washing and drying after a solution treatment), whereby there is the problem that the number of steps may be increased and the steps become complicated. Also, the movement amount of the samples between the respective preparation apparatus will be increased, whereby losses in both time and space ape increased. The increase of step number, complicatedness of the steps, increase of movement amount of samples involve the problem of increasing the attachment of dust. Further, by use of a resist and peel-off thereof, the resist peeled off becomes dust to be attached on the sample surface, whereby there is the problem that performances of the device deteriorate and also the yield is lowered.

SUMMARY OF THE INVENTION

The present invention has been accomplished in view of the problems in the various etching techniques utilizing the fine working process as described above, and its object is to provide a process capable of forming a patterned portion having resistance to an etching by utilizing the photoirradiation without utilizing the formation step of the resist pattern in the photo-lithography, and forming an etching pattern at a high yield and at a low cost.

Also, the present invention has been accomplished in view of the problems in the various etching techniques utilizing the fine working process as described above, and another object is to provide a process for forming an etching pattern capable of accomplishing a high yield, a low cost and shortening the time required for the preparation steps to a great extent by using the method comprising a combination of the film formation of a polymerized film by use of the CVD method and the patterning utilizing the photoirradiation of the polymerized film in place of the photolithography for formation of the resist pattern, and dividedly practicing the formation step of the resist pattern comprising the polymerized film and the etching treatment step by radicals.

Still another object of the present invention is to provide a phototreatment apparatus which can simplify the preparation steps of the device, capable of selectively performing the photoetching with different light intensities without exchange of the photomask.

In addition, it is also another object of the present invention is to realize a process and an apparatus for preparing a semiconductor device which can prevent oxidation of the surface, reduce the preparation steps and the movement amount of the device, improve the device performances and improve the yield.

Still another object of the present invention is to provide a pattern formation apparatus by use of a selective irradiation light which can form a predetermined pattern with a good precision on a sample substrate.

Still another object of the present invention is to provide a process for forming an etching pattern, which comprises: selectively irradiating a light to a clean surface of a material to be worked by etching so as to form radicals from a photoradical forming substrate in an atomsphere of the substance, forming a modified portion having etching resistance at a photo-irradiated portion of the surface, and then subjecting an unmodified portion of the surface of the material to be worked to an etching treatment, thereby forming an etching pattern corresponding to a pattern formed by the irradiation.

Still another object of the present invention is to provide a process for forming an etching pattern, which comprises: providing a resist pattern of a polymerized film formed by a CVD method on the clean surface of a material to be worked by etching, and then subjecting the surface of the material to be worked having the resist pattern provided thereon to the etching treatment.

Still another object of the present invention is to provide a process for forming a semiconductor device comprising the first step of cleaning the surface of a substrate, the second step of depositing a film of a semiconductor, metal or insulator on the substrate cleaned in the first step, the third step of forming a mask by irradiation of a selected light so as to form a desired device structure on the film deposited in the second step and the fourth step of affecting etching by using the mask formed in the third step as a light shielding member, wherein the respective steps of the first to fourth are consistently carried out in the state shielded from air and under a reduced pressure.

Still another object of the present invention is to provide an apparatus for preparing a semiconductor device having a loadlock chamber to take in and out a substrate, a cleaning chamber to clean the surface of the substrate, a film forming chamber to deposit a film of a semiconductor, metal or insulator on the cleaned surface, a latent image chamber provided with a light entering window to form a mask by irradiation of a selective light transmitted through the light entering window to the film deposited on the substrate, an etching chamber to effect etching of the film and a conveying chamber to convey the substrate, wherein the respective chambers are vacuum sealable, and the loadlock chamber, the cleaning chamber, the film forming chamber, the latent image chamber and the etching chamber are arranged around the conveying chamber as the center and communicated to the conveying chamber through gate valves individually provided.

Still another object of the present invention is to provide an apparatus for preparing a semiconductor device having a loadlock chamber to take in and out a substrate, a cleaning chamber to clean the surface of the substrate, a film forming chamber to deposit a film of a semiconductor, metal or insulator on the cleaned substrate, a photoetching chamber provided with a light entering window to effect photoetching by irradiation of a selective light transmitted through the light entering window on the film deposited on the substrate and a conveying chamber to convey the substrate, wherein the respective chambers are vacuum sealable, and the loadlock chamber, the cleaning chamber, the film forming chamber and the photoetching chamber are arranged around the conveying chamber as the center and communicated to the conveying chamber through the gate valves individually provided.

Still another object of the present invention is to provide a phototreatment apparatus having:
  a light source,
  a treatment vessel having a window, and
  a photomask and a sample to be treated which are located in parallel in the treatment vessel,
  effecting a phototreatment for the sample to be treated by irradiating the light emitted from the light source through the window and photomask to the sample to be treated, and
  the photomask being provided with a mask pattern formed of a light shielding portion, a light transmitting portion and a light semitransmitting portion.

Still another object of the present invention is to provide a photomask having:
  a support capable of transmitting light, a light-shielding pattern which shields the light, and a light absorbing member provided corresponding to the light-shielding pattern.

Still another object of the present invention is to provide a photomask having a light transmitting portion and a light shielding portion, wherein a portion other than the light transmitting portion and the light shielding portion has a light transmittance between the light transmittances of the respective portions.

Still another object of the present invention is to provide a pattern forming apparatus by use of a selectively irradiated light having:

a light source, a treatment vessel having a light transmitting window for permitting the light entered from the light source to transmit therethrough, a photomask having a desired light shielding pattern located proximate in the treatment vessel, and a gas introducing pipe for introducing a desired gas into the treatment vessel from outside, wherein a light absorbing member for absorbing the light having the same pattern shape as the light shielding pattern is formed on the surface of the photomask confronting the substrate.

DETAILED DESCRIPTION OF THE PREFERRED EMBODIMENTS

Figure 1:
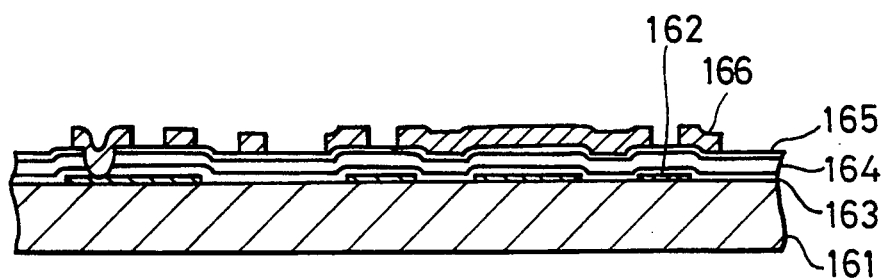
FIG. 1 through FIG. 3 are schematic sectional views stepwise showing the phototreatment steps.
Figure 2:
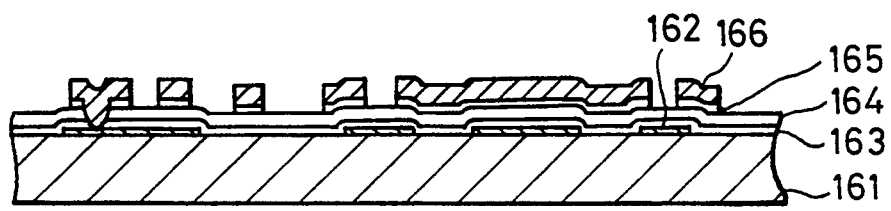
Figure 3:
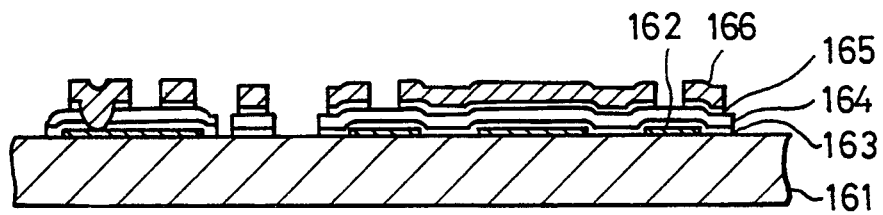

The present invention enables an etching formation with a high yield, because of site selective irradiation treatment of light in an atmosphere of a photoradical forming substance which can easily accomplish a high yield for the formation of a pattern-shaped portion having an etching resistance.

Also, according to the process of the present invention, it is possible to form an etching pattern at a low cost by reducing the cost required for the materials and the steps necessary for the formation steps of the resist pattern in photolithography.

Further, in the process of the present invention, photoirradiation is not utilized for etching as in photoetching, but for the formation of the portion having an etching resistance by the modification of a predetermined portion on the surface of the material to be worked, and can be practiced by use of the photoirradiation apparatus utilized presently in a practical application.

When the etching of a silicon nitride film is practiced by utilizing the resist pattern formed by the modification of silicon nitride according to the process of the present invention, the pressure resistance of the resist pattern can be improved.

Alternatively, it becomes possible to form an etching pattern with a high yield, since there is employed the method which utilizes a combination of film formation of a polymerized film according to a CVD method which can easily accomplish a high yield and patterning of the polymerized film by site selective irradiation of light.

Also, according to the process of the present invention, it is possible to form an etching pattern at a low cost by reducing the cost required for the materials and the steps necessary for the formation steps of the resist pattern in photolithography.

Further, in the process of the present invention, photoirradiation is not utilized for etching as in photoetching, but for patterning of the polymerized film formed by a CVD method, and can be practiced by use of the photoirradiation apparatus utilized presently in a practical application.

Also, by dividing the formation step of etching resist utilizing photoirradiation and etching treatment step by radicals, and independently performing each of them, it becomes possible to shorten the time required for formation of the etching pattern to a great extent.

Of course, the resist pattern by surface modification and the resist pattern by the polymerized film formed according to a CVD method may be also combined. For example, by forming a resist pattern by the polymerized film on the resist pattern by surface modification, the etching resistance of the resist pattern can be further enhanced.

Also, by forming the mask pattern provided on the photomask by the light-shielding portion, the light-transmitting portion and the light-semitransmissive portion, the intensities of the light passing through the respective portion become different from each other. Due to this difference, the sample to be treated is selectively irradiated with the light having different intensities from each other, whereby the degree of photoetching, surface modification or film formation selectively becomes different, whereby the treatment performed in a plurality of steps can be done in one step.

Further, according to the preparation apparatus of the present invention, since the respective steps for preparing a semiconductor device are comprehensively performed in the state shielded from air and under reduced pressure, the oxidation of the substrate and the attachment of dust can be prevented, simultaneously with reduction of the number of steps. Further, since the etching or photoetching is effected by use of the mask formed by the selective photoirradiation, there will be no generation of dust due to the resist peeled off.

Further, in the pattern forming apparatus by use of the selective irradiation light of the present invention, since a light absorbing member which has the same pattern as the light-shielding pattern and absorbs the light emitted from the light source is formed on the surface confronted with the sample substrate of the photomask, the above light reflected by the above sample substrate is absorbed at the light absorbing member and is not returned again to the sample substrate. Also, since the pattern shape of the light absorbing member is the same as the above light-shielding pattern and the above light irradiated to the above sample substrate is not absorbed unnecessarily by the light absorbing member, the above light is irradiated only to a predetermined portion of the sample substrate, whereby a predetermined pattern can be formed with a good precision on the sample substrate.

Here, as a method for forming a predetermined pattern on the above sample substrate, it is not limited to the method by photoetching, and also the method by surface modification or film formation may be similarly employed.

The process of the present invention is further described below in detail by referring to the drawings.

Figure 4:
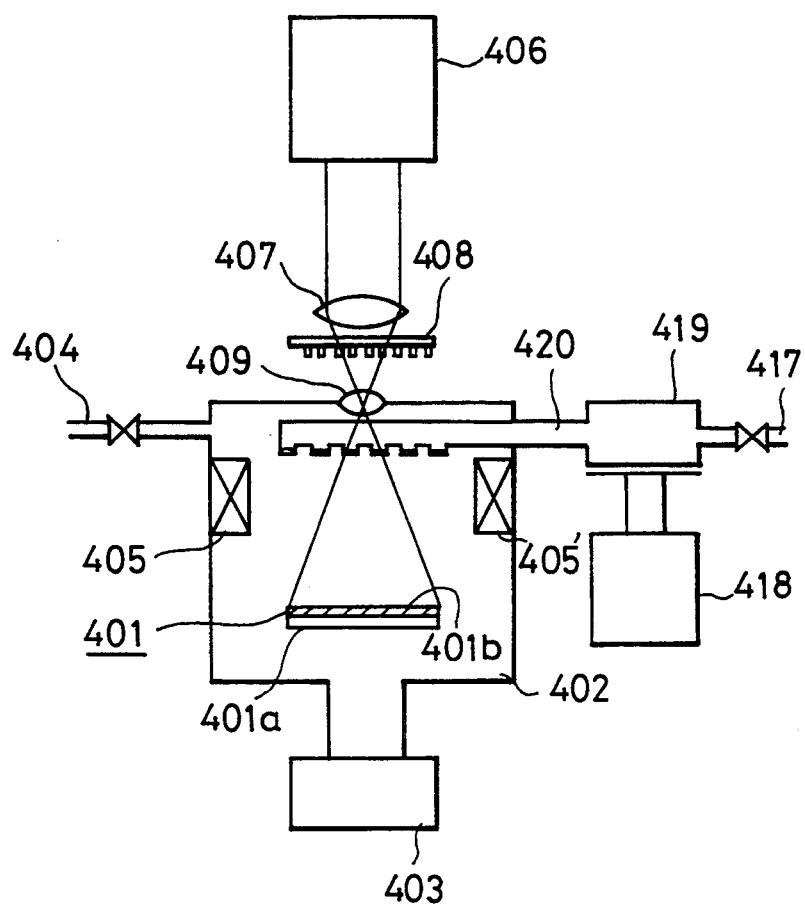
FIG. 4 and FIG. 5 are schematic illustrations of the apparatus which can be used in the process of the present invention.
Figure 5:
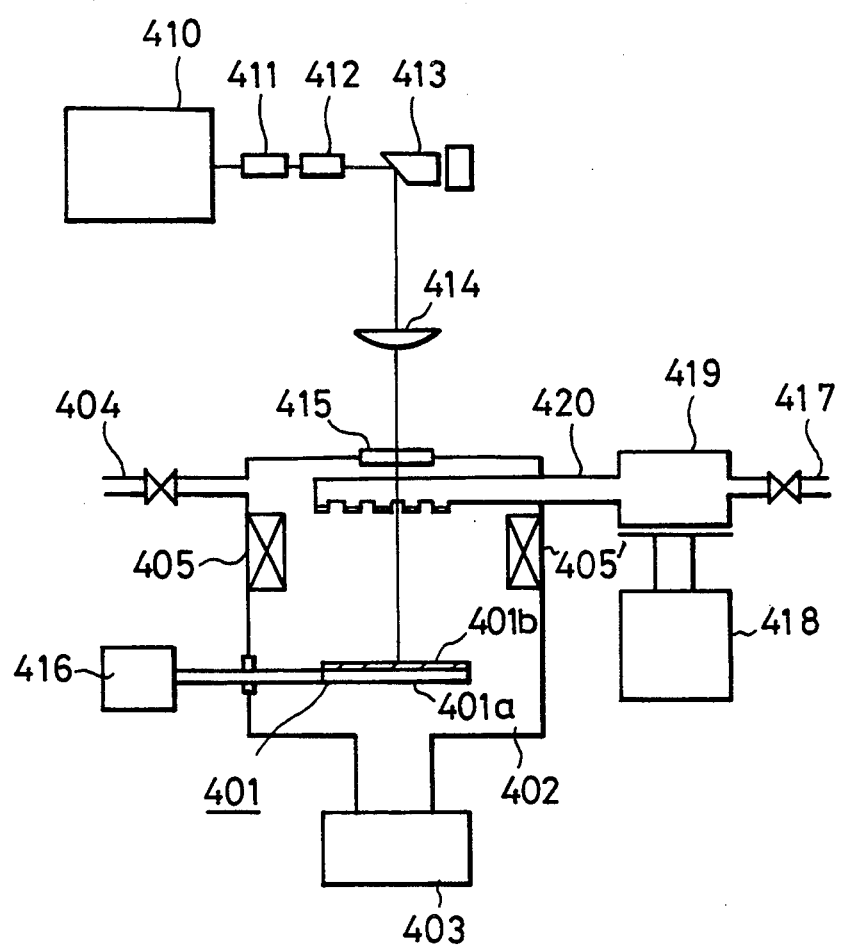

FIG. 4 and FIG. 5 illustrate the outline of the apparatus which can be used for the process of the present invention.

As the material which is to be worked according to the process of the present invention, there may be employed a material which can be etched in the etching treatment as described below, and has at least a portion which can be etched, comprising a material capable of forming a portion (an etching resistant portion) which is not etched by the etching treatment with the action of the radicals generated by photoirradiation in the presence of a photoradical forming substance.

As the portion to be worked, those constituted of metals, semiconductors, various insulating materials or various materials utilized for various electronic materials such as semiconductor devices, for example, one material selected from Al, Si, SiN, C, Ge, GaAs, Ti, Ta, Mo, W and Nb, etc., can be applied to the process of the present invention.

As the portion to be worked, for example, a thin film comprising a semiconductor, insulator or various metals formed on an appropriate substrate such as a silicon wafer, etc. according to the vacuum vapor deposition method, the CVD method, the sputtering method, the ion plating method, etc. is applicable.

In FIG. 4 and FIG. 5, a material to be worked 401 having a thin film 401$b$ comprising a semiconductor insulator or various metals formed on an appropriate substrate 401$a$ according to the thin film forming technique is shown by way of example.

First, as shown in the drawings, the material to be worked 401 is set at a predetermined position within a vacuum tank 402.

The thin film 401$b$, on account of the characteristics in the film forming step thereof, when contacted with air, frequently has a naturally oxidized film, water and an organic adherent formed on its surface. Accordingly, it becomes generally necessary to carry out the treatment for cleaning of the thin film 401$b$.

For the cleaning treatment, there may be preferably employed the method in which an inert gas, hydrogen gas, etc. are introduced through a gas introducing pipe 404 into the vacuum tank 402 which is made vacuum by an evacuation device 403, and plasma is generated by actuation of plasma generators 405 and 405', and the naturally oxidized film, water, organic adherents, etc. on the surface of thin film 401$b$ are removed with the radicals formed.

Further, after the film formation of the thin film 401$b$, by setting the thin film within the vacuum tank 402 without exposure to air, the thin film 401$b$ having a clean surface can be set within the vacuum tank 402 without performing the cleaning treatment.

Also, after the film formation of the thin film 401$b$, by performing the surface modification by irradiating hydrogen ions, fluorine ions, etc. to its surface, a clean surface or a surface which can be easily cleaned can be obtained by forming with difficultly a naturally oxidized film on the surface of the thin film 401$b$ or by attaching with difficultly water or adherents to the surface.

Such a treatment for cleaning in a combination of two or more may be also practiced.

In the process of the present invention, for the effective site selective surface modification of the surface to be etched such as the thin film 401$b$ surface, etc. with a good precision, it is extremely important that the surface to be etched is cleaned.

Next, a gas of a photoradical forming substance is introduced through a gas introducing pipe 404 into the vacuum tank 402, and a light is irradiated site-selectively to the portion of the thin film 401$b$ surface corresponding to the desired etching pattern.

As the site-selective photoirradiation method, for example, the projection exposure system shown in FIG. 4 and the laser direct drawing system shown in FIG. 5 can be utilized.

In the projection exposure system, as shown in FIG. 4, the exposure pattern possessed by an exposure mask 408 is projected to form an image by the light from a light source 406 passed through the optical system including lenses 407 and 408, to effect a pattern exposure to the thin film 401$b$ surface.

On the other hand, in the direct drawing system, as shown in FIG. 5, the continuous laser beam oscillated from a laser beam source 410 passes through an optical modulator 411, a collimator lens 412 and a rotatory multi-planar mirror 413, and exposure is effected by a spot image formation on the surface of the thin film 401$b$ within the vacuum tank 402 by f$\theta$ lens 414 from a window 415. The site selective photoirradiation in the laser direct drawing system can be performed by scanning the image forming position of the laser beam modulated by the optical modulator 411 in one direction of a thin film 401b surface by rotation of the rotatory multi-planar mirror 413, at the same time moving the image forming position of the laser beam by delivering the material to be worked 401 in the direction vertical to the scanning direction of the image forming position by use of a delivery system 416 of the material to be worked, and controlling the scanning by the rotatory multi-planar mirror, the delivery of the material to be worked, and the timings of irradiation and non-irradiation of the laser.

The image source for photoirradiation to be used in the process of the present invention is chosen depending on the kind of the photoradical forming substance introduced into the vacuum tank 402.

As the photoradical forming substance, for example, a compound capable of forming oxygen radicals such as oxygen, nitrogen dioxide, ozone, nitrous oxide, carbon dioxide, etc. can be preferably utilized, and the above-described operations can be done by introducing these gases into the vacuum tank 402.

As the light source, one capable of generating a light having a wavelength of UV-ray absorption end wavelength of the photoradical forming substance can be utilized without any limitation.

For example, when oxygen gas is used as the photoradical forming substance, since the UV-ray absorption end wavelength in its radical generation is about 242 nm, a light source generating light having a shorter wavelength than that can be utilized, for example, a rare gas excimer laser, rare gas halide excimer laser, etc. can be utilized.

On the other hand, when nitrogen dioxide gas is used as the photoradical forming substance, since the UV-ray absorption end wavelength in its radical regeneration is near 400 nm, for example, in addition to excimer lasers such as a rare gas excimer laser, rare gas halide excimer laser, etc., a continuous oscillation laser such as an argon ion laser, a krypton ion laser, a He-Cd laser, etc. can be utilized, whereby there are included the advantages such that the choice of light source can be expanded and also that handling is easy.

Through the action of the radicals generated thus by photoexcitation, the photoirradiated portion of the thin film 401b is modified.

The modified portion thus formed is not etched by halogen atom radicals such as fluorine radicals, chlorine radicals, etc., while the unmodified portion where no photoirradiation was effected remains in the state which is etched by these reaction species for etching.

Next, when unnecessary remaining gas is discharged from the vacuum tank 402 by the evacuation device 403 to set a predetermined vacuum degree within the vacuum tank 402, a compound gas for etching is introduced through a gas introducing pipe 415, and a microwave is excited within a plasma pipe 419 with the microwave oscillated from a magnetron 418, and introduced through a transporting pipe 420 into the vacuum tank 402.

As the compound for etching, any compound capable of generating radicals enabling etching of the thin film 401b can be utilized without any limitation.

For example, substances capable of generating halogen atom radicals such as chlorine radicals, fluorine radicals, etc. such as $Cl_2$, $CF_3Cl$, $CCl_4$, $NF_3$, etc. can be preferably utilized.

By use of FIG. 4 and FIG. 5, another process of the present invention is described.

The material to be worked in the second process of the present invention has a portion to be etched consisting of a material which can be etched in the etching treatment as described below.

As the portion to be worked, various materials to be utilized for various electronic materials of semiconductor devices, comprising metals such as Al, Si, Cr and Au, semiconductors such as CdS, GaAs and Ge, various insulating materials, can be applied to the process of the present invention.

As the portion to be worked, for example, there may be exemplified those formed by forming thin films comprising semiconductors, insulators or various metals formed on an appropriate substrate according to the thin film formation technique such as the vacuum vapor deposition method, the CVD method, the sputtering method, the ion plating method, etc.

In FIG. 4 and FIG. 5, those having the thin film 401b comprising a semiconductor, an insulator or various metals formed on an appropriate substrate 401a according to the thin film forming technique are exemplified.

First, as shown in the drawings, the material to be worked 401 is set at a predetermined position within the vacuum tank 402.

The thin film 401b, for the characteristics of the film forming step thereof, when contacted with air, a naturally oxidized film, water, organic adherents, etc. are formed on its surface in many cases. Accordingly, a treatment for cleaning of the thin film 401b is generally required.

For the cleaning treatment, there may be preferably utilized the method in which an inert gas, hydrogen gas, etc. is introduced through the gas introducing pipe 404 into the vacuum tank 402 which is made to a vacuum atmosphere by the evacuation device 403, and a plasma is generated by actuation of the plasma generators 405 and 405' to remove the naturally oxidized film, water, organic adherents, etc. on the thin film 401b surface.

Further, after film formation of the thin film 401b, by setting the thin film within the vacuum tank 402 without exposure to air, a thin film 401b having the cleaned surface can be set within the vacuum tank 402.

Also, after film formation of the thin film 401b, before exposure to air, by irradiating hydrogen ions, fluorine ions to its surface to effect the surface modification, by making formation of a naturally oxidized film, etc. or adhesion of water or adherents difficult, a cleaned surface or a surface which can be readily cleaned can be obtained.

Two or more treatments may be also used in combination for cleaning.

In the process of the present invention, for affecting the site selective etching with a good precision on the surface to be etched such as the thin film 401b surface, it is very important that the surface to be etched is cleaned.

Next, a resist pattern is provided on the thin film 401b surface by utilizing the CVD method.

For formation of the resist pattern, for example, the methods a to c as described below can be applied.

a) A polymerized film capable of being patterned by utilization of photoirradiation is formed by the CVD method, and then the predetermined portion of the polymerized film is selectively removed by utilizing photoirradiation to form a resist pattern with a desired shape.

More specifically, for example, a gas capable of forming a polymerized film by decomposition with plasma is introduced from the gas introducing pipe 404 in the apparatus shown in FIG. 4 and FIG. 5 into the vacuum tank 402, and subjected to plasma decomposition by the plasma generators 405 and 405' to form a polymerized film with the plasma decomposed product of the gas introduced onto the thin film 401b.

Alternatively, a gas capable of forming a polymerized film by decomposition with plasma is introduced through the gas introducing pipe 417 into the vacuum tank 402, a microwave is excited by the microwave oscillated from the magnetron 418 in the plasma tube 419, and a polymerized film of the decomposed product formed by the microwave on the thin film 401b through the transporting pipe 420 is formed.

The polymerized film thus formed is then patterned according to the patterning method utilizing photoirradiation.

As the patterning method, for example, there are the method utilizing the radicals which can be generated by photoirradiation and the method utilizing the heat which can be generated by photoirradiation.

In the method utilizing the radicals, a gas capable of generating radicals by photoexcitation is introduced through the introducing pipe 404 into the vacuum tank 402, and in such a state the photoirradiation is effected on the polymerized film corresponding to a desired pattern to generate the radicals of the introduced gas at the photoirradiated portion, and the polymerized film is decomposed and removed by the action of the radicals, while the non-irradiated portion being left selectively on the thin film 401b surface, thereby a resist pattern is obtained.

In the method utilizing heat, by irradiating the polymerized film with a light capable of pyrolyzing the polymerized film for example, a laser, etc., corresponding to a desired pattern, heat is generated at the site of the polymerized film irradiated and the polymerized film is decomposed to remove through the action of heat at the photoirradiated portion while the non-irradiated portion being left selectively on the thin film 401b surface, thereby a resist pattern is obtained.

These methods can be utilized either alone or in combination.

b) A gas capable of forming a polymerized film on the thin film 401b decomposed by photoexcitation is introduced through the introducing pipe 404 into the vacuum tank 402, and in such a state a light capable photoexcitation of the gas is irradiated to the portion of the thin film 401b corresponding to a desired etching pattern, and a decomposed product by the photoexcitation of the introduced gas is generated at the photoirradiated portion, whereby a polymerized film is formed. Since a polymerized film is not formed at the non-irradiated portion, a resist pattern corresponding to the photoirradiated portion can be obtained.

c) In the state where a gas capable of forming polymerized film on the thin film 401b decomposed with heat is introduced through the introducing pipe 404 into the vacuum tank 402, a light capable of heating locally the thin film 401b surface is irradiated to generate the heat necessary for pyrolysis of the introduced gas at the photoirradiated portion and to form a polymerized film locally according to the hot CVD method. Since the polymerized film is not formed at the non-irradiated portion, a resist pattern corresponding to the photoirradiated portion is obtained.

The methods b and c can be utilized alone or in combination.

For the site selective photoirradiation in the patterning method as described above, for example, the projection exposure system shown in FIG. 4 and the laser direct drawing system shown in FIG. 5 can be utilized. These systems have already been explained in the process as described above, and therefore are omitted here.

The light source for photoirradiation to be used in the second process of the present invention, in the method a as described above, can be chosen suitably depending on the kind of the substance for decomposition of the polymerized film, and in the methods b and c as described above, depending on the kind of the substance for formation of the polymerized film.

As the substance capable of generating radicals by the light for decomposition of the polymerized film, for example, a compound capable of forming oxygen radicals such as oxygen, nitrogen dioxide, ozone, nitrous oxide, carbon dioxide can be preferably utilized, and the above-described operations can be done by introducing these gases into the vacuum tank 402.

As the light source, one capable of generating a light having a wavelength of UV-ray absorption end wavelength of the photoradical forming substance can be utilized without any limitation.

For example, when oxygen gas is used as the photoradical forming substance, since the UV-ray absorption end wavelength in its radical generation is about 242 nm, light sources which generate light having a shorter wavelength than that can be utilized. For example, a rare gas excimer laser, rare gas halide excimer laser, etc. are utilized.

On the other hand, when nitrogen dioxide gas is used as the radical forming substance, since the UV-ray absorption end wavelength in its radical regeneration is near 400 nm, for example, in addition to excimer lasers such as a rare gas excimer laser, rare gas halide excimer laser, etc., a continuous oscillation laser such as an argon ion laser, a krypton ion laser, a He-Cd laser, etc. can be utilized, whereby there are included the advantages such that the choice of light source can be expanded and also that handling is easy.

The polymerized film for formation of the resist pattern can be formed according to the CVD method by use of a compound which is the hydrocarbon compound substituted with at least one selected from fluorine and chlorine for a part or all of the hydrogens thereof.

As the starting material for formation of the polymerized film, compounds such as $CF_2Cl_2$, $CF_3Cl$, $CCl_4$, $C_2Cl_2F_4$, $CH_3Cl$, $CH_3F$, $CF_4$, $C_2F_6$ and the like and/or those compounds diluted with the diluting gas such as $Cl_2$, $H_2$, hydrocarbon compounds (e.g. $C_2H_2$, $C_2F_6$, etc.) may be preferably used.

The resist pattern comprising the polymerized film formed according to the CVD method as described above cannot be etched with halogen element radicals for etching such as fluorine radicals, chlorine radicals or the like.

Next, unnecessary residual gas, etc. is discharged from the vacuum tank 402 by the evacuation device 403 to set the vacuum tank 402 internally to a predetermined vacuum degree, whereupon a compound gas for etching is introduced through the gas introducing pipe 417 and is excited in the plasma tube 419 by the microwave oscillated from the magnetron 418 to be introduced through the transporting pipe 420 into the vacuum tank 402.

As the compound for etching, any compound capable of generating radicals which enable etching of the thin film 401b can be utilized.

For example, a compound capable of generating halogen element radicals such as chlorine radicals, fluorine radicals, such as Cl₂, CF₃Cl, CCl₄, NF₃, etc. can be utilized.

Figure 6:
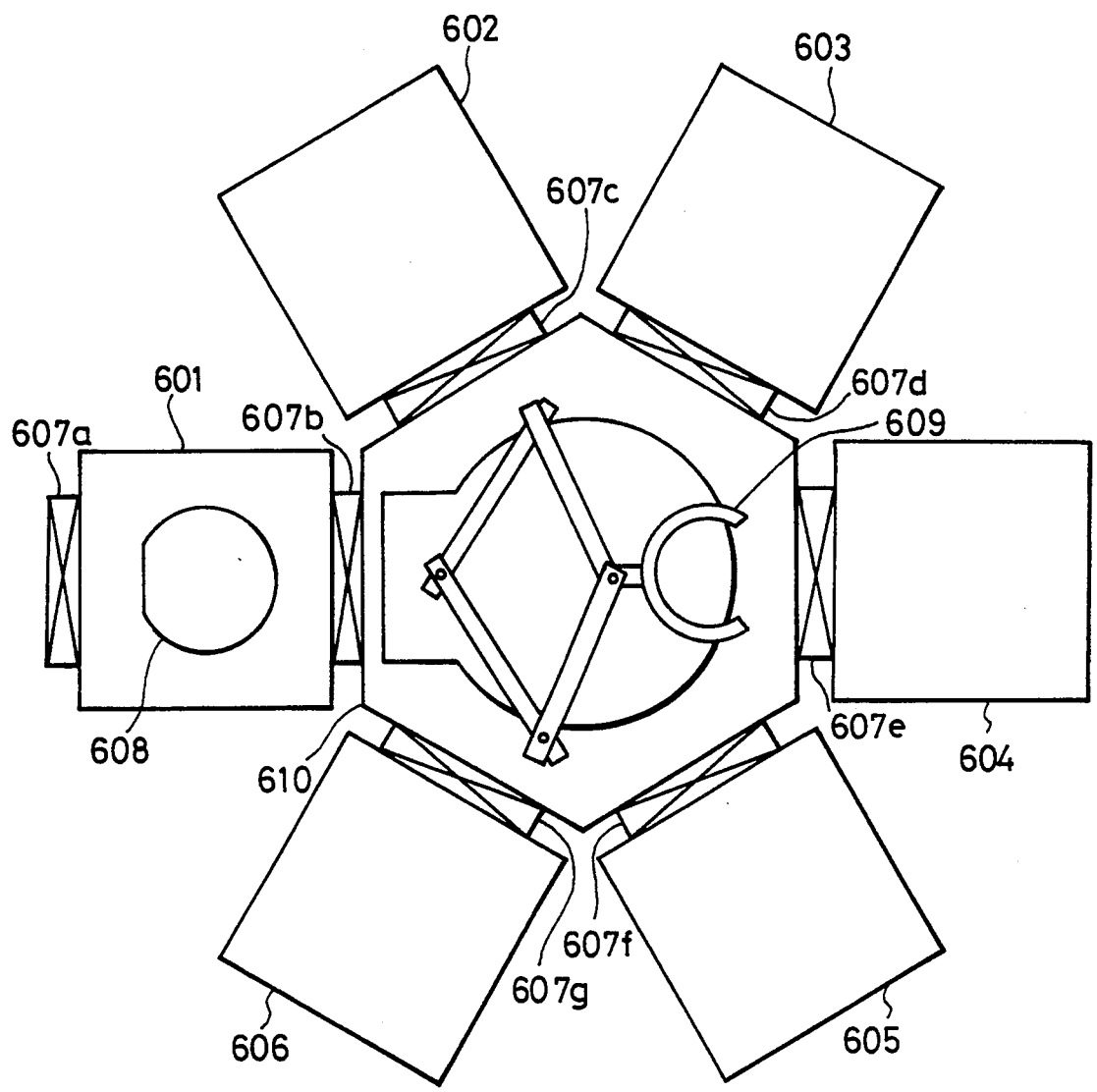
FIG. 6 is an upper view showing one constitutional example of the preparation apparatus of the present invention.

FIG. 6 is a schematic upper view showing the constitution of an example of a preferable apparatus for applying the process of the present invention as described above, which is used for forming a pattern on a sample 608.

In FIG. 6, 601 is a loadlock chamber for introducing and taking out the sample 608, and 602 a cleaning chamber for cleaning the surface of the sample 608 by use of plasma. 603 is a sputtering film forming chamber for forming a film of a metal by sputtering. 604 is a plasma film forming chamber for forming an insulating film and semiconductor film by plasma. 605 is an etching chamber for effecting the chemical dry etching of the film. 609 is a conveyer for conveying the sample 608 by way of a conveying mechanism not shown, and is provided within a conveying chamber 610.

The loadlock chamber 601, the cleaning chamber 602, the sputtering film forming chamber 603, the plasma film forming chamber 604, the etching chamber 605, the latent image chamber 606 and the conveying chamber 610 are all constituted vacuum-sealedly and equipped respectively with vacuum evacuation devices (not shown) for vacuum evacuation internally of the chambers. The loadlock chamber 601, the cleaning chamber 602, the sputtering film forming chamber 603, the plasma film forming chamber 604, the etching chamber 605 and the latent image chamber 606 are respectively arranged around the conveying chamber 610, and communicated to the conveying chamber 610 respectively through the gate valves 607b to 607g. The loadlock chamber 601 is also provided with, in addition to the gate valve 607b communicated to the conveying chamber 610, the gate valve 607a for taking in and out the sample 608 between the chamber and outside.

FIG. 7 through FIG. 10 are respectively schematic sectional views for illustrating the constitutions of the cleaning chamber 602, the sputtering film forming chamber 603, the plasma film forming chamber 604, the etching chamber 605 and the latent chamber 606 in FIG. 6.

Figure 7:
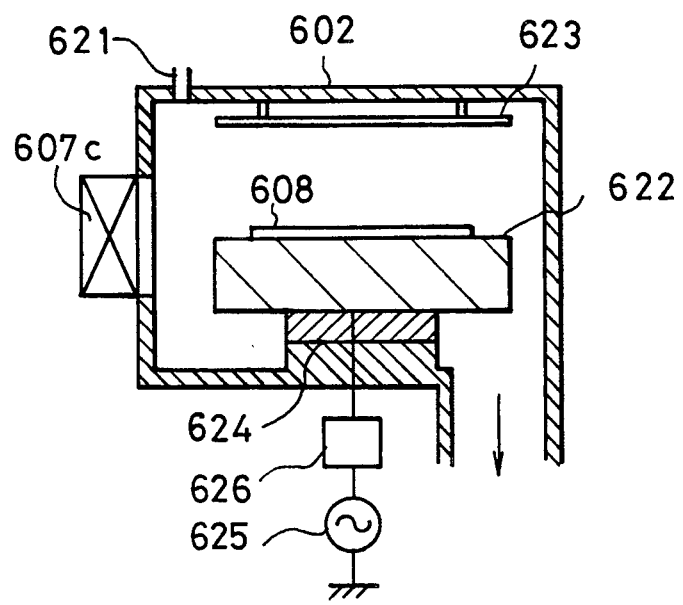
FIG. 7 through FIG. 11 are schematic sectional views respectively illustrating the cleaning chamber 602, the sputtering film forming chamber 603, the plasma film forming chamber 604, the etching chamber 605 and the latent image chamber 606 in FIG. 6.
Figure 8:
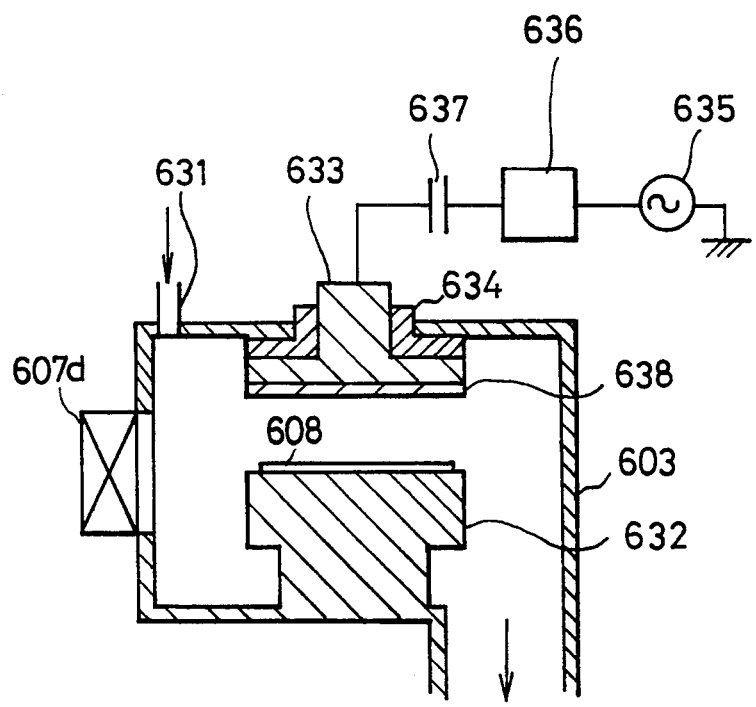
Figure 9:
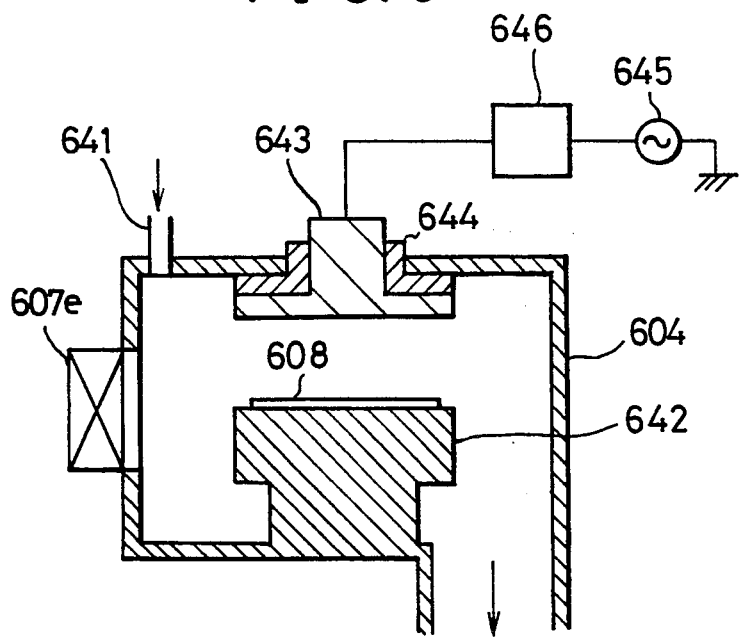
Figure 10:
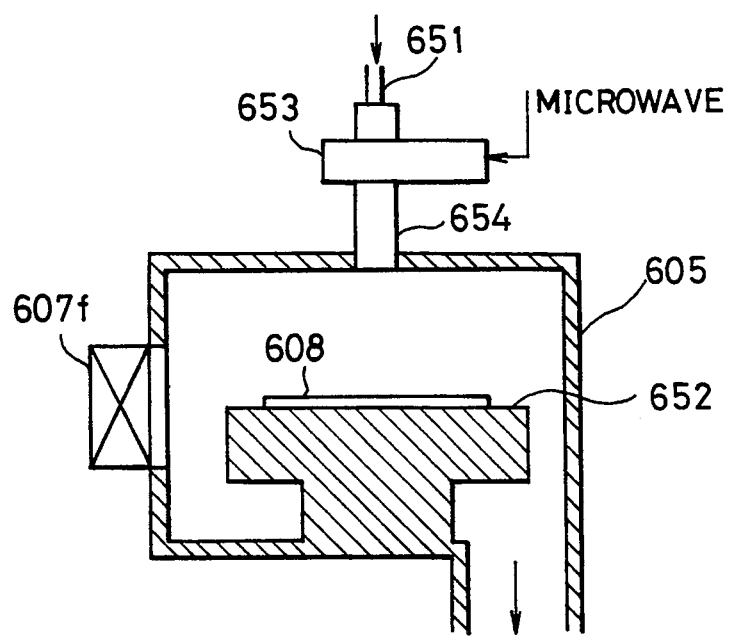
Figure 11:
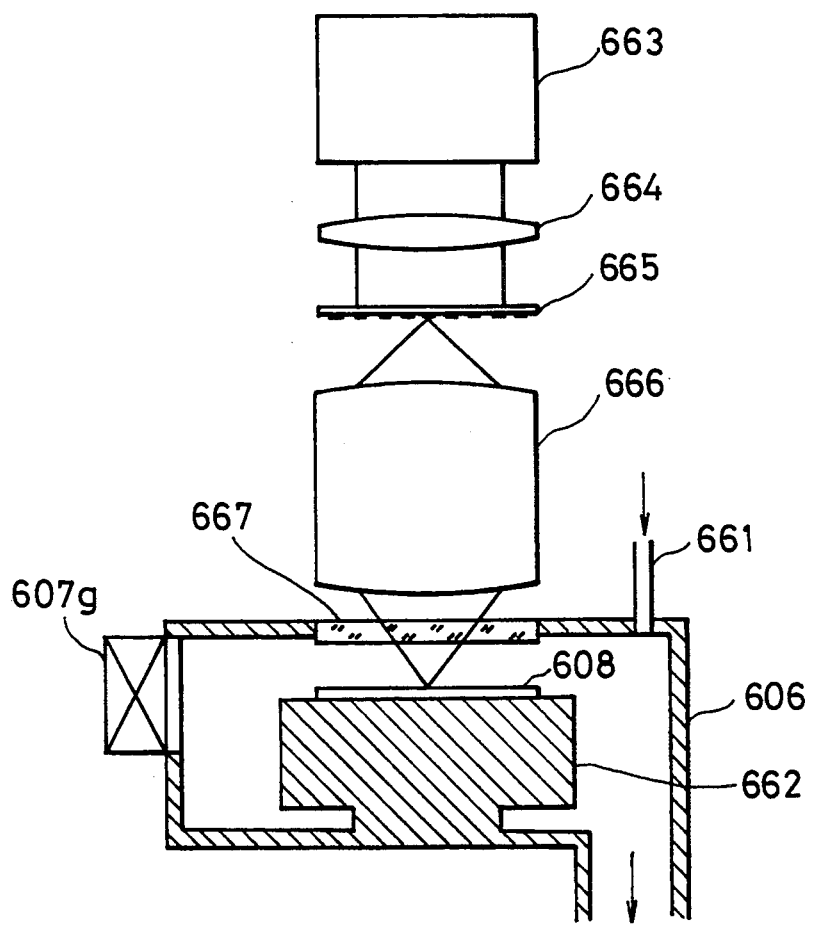

FIG. 7 shows the cleaning chamber 602. In the same Figure, 621 is the gas introducing inlet provided above the cleaning chamber 602 for introducing cleaning gas into the cleaning chamber 602, 622 a sample holding stand for holding the sample 608 placed in the cleaning chamber 602, 623 a counter-electrode opposed to the sample holding stand 622, 624 the insulator for insulating the sample holding stand 622 from the vacuum vessel constituting the cleaning chamber 602, 625 a high frequency power source of 13.56 MHz, 200 W, which is connected to the sample holding stand 622. 626 is the matching box for taking matching between the sample holding side and the high frequency power source side. FIG. 8 shows the sputtering film forming chamber 603. In the same Figure, 631 is the gas introducing inlet for introducing the sputtering gas into the sputtering film forming chamber 603, 632 is the sample holding stand for holding the sample 608 placed in the sputtering film forming chamber 603, 633 is the counter-electrode provided as opposed to the sample holding stand 632 and applied with high frequency power, 634 the insulator for insulating the counter-electrode 633 from the vacuum vessel constituting the sputtering film forming chamber 603, 635 the high frequency power source of 13.56 MHz and 500 W, 636 the matching box for taking matching between the sample holding stand 632 and the high frequency power source 635 side, 637 the condenser for insulating direct currently the counter-electrode 634, and 638 the sputtering metal. FIG. 9 shows the plasma film forming chamber 604. In the same Figure, 641 is the gas introducing inlet for introducing the deposition gas into the plasma film forming chamber 604, 642 the sample holding stand for holding the sample 608 placed in the plasma film forming chamber 604, 643 the counter-electrode provided as opposed to the sample holding stand 642 and applied with high frequency power, 644 the insulator for insulating the counter-electrode 643 from the vacuum vessel constituting the plasma film forming chamber 604, 645 the high frequency power source of 13.56 MHz and 350 W, and 646 the matching box for taking matching between the sample holding stand 642 and the high frequency power source 645. FIG. 10 shows the etching chamber 605. In the same Figure, 652 is the sample holding stand for holding the sample 608 placed in the etching chamber 605, 653 the microwave plasma gas excitation device for generating the excited gas to be fed into the etching chamber 605, 651 the gas introducing inlet for feeding the etching gas to the microwave plasma gas excitation device 653, 654 the transporting pipe for transporting the excited gas generated in the microwave plasma gas excitation apparatus 653 to the etching chamber 605 and is provided at the position opposed to the sample holding stand 652. FIG. 11 shows the latent image chamber 606. In the same Figure, 661 is the gas introducing inlet for introducing the latent image gas into the latent image chamber 606, 662 the sample holding stand for holding the sample 608 set within the latent image chamber 606, 663 the KrF excimer laser which is the light source, 664 the illuminating optical system for illuminating the mask 665 as described below by the generated light at the light source 663, 665 the mask (or reticle) patterned by Cr on the quartz plate, 666 the projection optical system for forming an image of the mask pattern on the surface of the sample 608, and 667 the window for introducing the light coming out from the projection optical system 666 into the latent image chamber 606. Of the respective devices as described above, the light source 663, the illumination optical system 664, the mask 665, and the projection optical system 666 are provided above the latent chamber 606.

By making the apparatus constitution as described above, the respective steps for preparing a semiconductor device can be carried out consistently while maintaining the state shielded from air and reduced in pressure without use of a resist. By doing so, a semiconductor device improved in performance can be prepared without oxidation of the surface of the member to be treated. Also, preliminary steps such as the step of vacuum evacuation from an atmospheric pressure between the respective steps and the steps of washing and drying after the solution treatment can be made unnecessary, whereby the productivity can be improved. Further, the number of steps and the movement amount between the steps can be reduced to reduce the chances of attachment of dust, and also the generation of dust due to resist peel-off does not occur, whereby the yield can be improved.

The apparatus described by referring to FIG. 6 to FIG. 11 is not limited by the constitution as described above, but can be modified within the scope of the present invention. Particularly, although the conveying chamber 610 is surrounded by the respective chambers, it may be a linear shape in which the respective chambers are arranged in series and provided with the conveying chamber. It is also possible to make the conveying chamber movable, thereby making it connectable and releasable for each chamber.

Also, the present apparatus is applicable to the case of forming a resist pattern with a polymerized film other than the case of forming the modified portion as described above.

Figure 12:
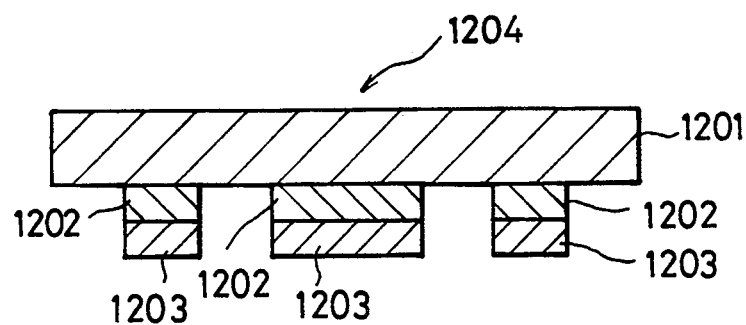
FIG. 12 is a schematic sectional view of the photomask which can be preferably used in the pattern forming apparatus by use of the selective irradiation light of the present invention.
Figure 13:
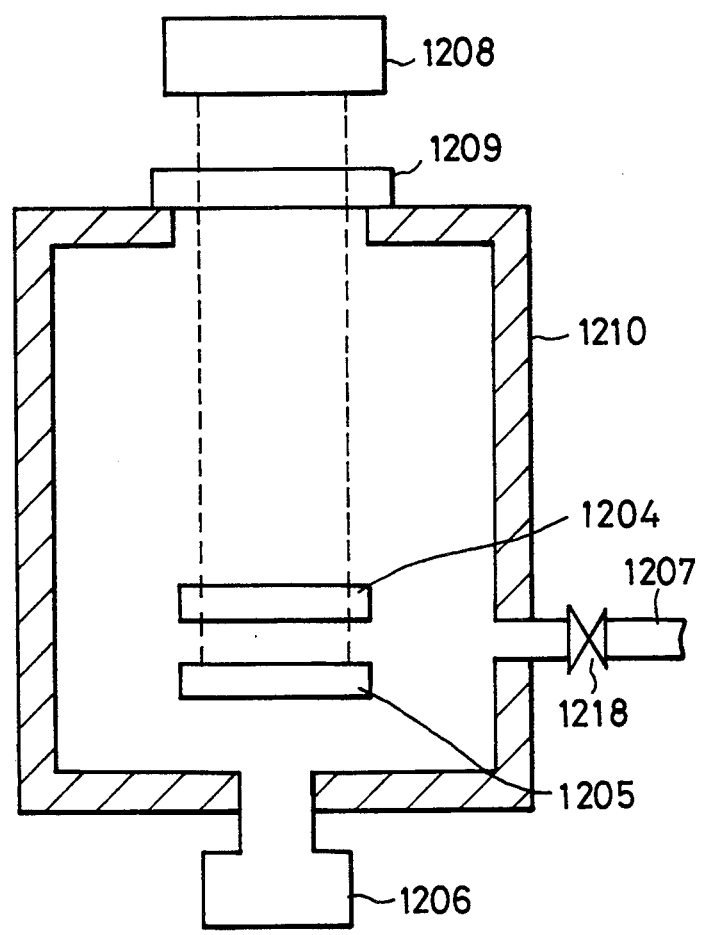
FIG. 13 is a schematic sectional view showing a constitutional example of the pattern forming apparatus by use of the selective irradiation light of the present invention.
Figure 14:
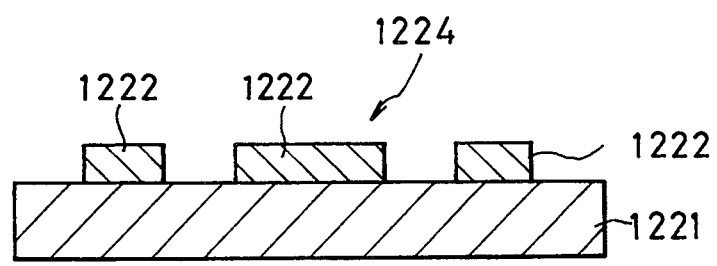
FIG. 14 is a schematic sectional view of one of the prior art examples of the photomask.

FIG. 12 is a schematic sectional view of the photomask preferably used in the pattern formation apparatus by use of selective irradiation light, FIG. 13 a schematic sectional view showing a preferable constitution example of the pattern formation apparatus by use of selective irradiation light, FIG. 14 a schematic sectional view showing an example of the photomask of the prior art. 1221 is the light-transmissive plate, 1222 the light-shielding pattern and 1224 the photomask.

The photomask 1204 to be used in this Example has the desired light-shielding pattern 1202 formed of a metal, etc. on the light-transmissive substrate 1201 similarly as that of the prior art, but is different from that of the prior art in that the light absorbing member 1203 having the same as the light-shielding pattern 1202 is formed in contact with the light-shielding pattern 1202.

The pattern formation apparatus by use of selective irradiation light of this Example, as shown in. FIG. 13, has the light source 1208 and the treatment vessel 1210 having the light-transmissive window 1209 for transmitting the light irradiated from the light source 1208, connected with the gas introducing pipe 1207 and the evacuation device 1206. The above photomask 1204 and the sample substrate 1205 are set in parallel and proximate to each other within the above treatment vessel 1210, and by opening of the valve 1218, a predetermined gas is introduced from outside through the above gas introducing pipe 1207 into the above treatment vessel 1210. After the pressure within the above treatment vessel 1210 is maintained at a predetermined value by the above evacuation device 1206, light is selectively irradiated through the above light-transmissive window 1209 and the above photomask 1204 to the above sample substrate 1205, whereby the region of the sample substrate 1205 irradiated by the light is photoetched to form a predetermined pattern on the sample substrate 1205.

At this time, the light reflected on the above sample substrate 1205 is returned to the above photomask 1204. But since the photomask 1204 has already the above light absorbing member 1203 formed with the same shape as the above light-shielding pattern 1202, the above-mentioned reflected light is absorbed in the light absorbing member 1203, and therefore it is not reflected on the above photomask 1204 and returned to the above sample substrate 1205. Accordingly, a predetermined pattern can be formed with a good precision on said sample substrate 1205.

Next, by referring to the pattern formation apparatus by use of the selective irradiated light of this embodiment, an example trially made having formed practically a pattern on the sample substrate 1205 is described.

By constituting the photomask as described above, namely forming a light absorbing member which absorbs the light emitted from the light source, having the same shape as the light-shielding pattern, on the surface of the photomask opposed to the sample substrate, the above light is irradiated only to the predetermined portion of the sample substrate, and therefore the predetermined pattern can be formed with a good precision on the sample substrate.

Here, though this is explained by referring to photoetching as an example, the same effect can be obtained even when one having the constitution as described above may be employed as the photomask to be used for affecting the surface modification or film formation.

Figure 15:
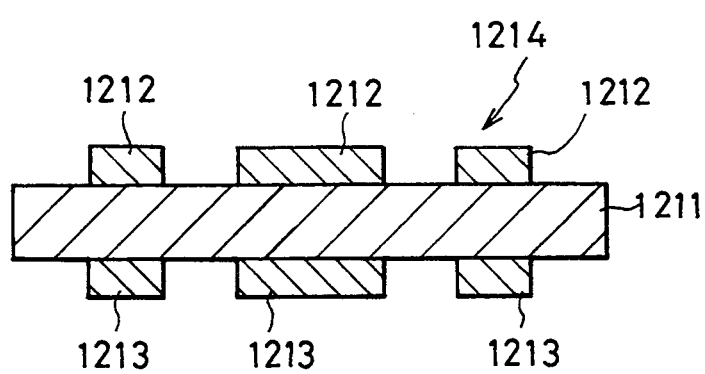
FIG. 15 is a schematic sectional view of another example of the photomask which can be used in the pattern forming apparatus by use of the selective irradiation light of the present invention.

FIG. 15 is a schematic sectional view of another photomask of the present invention.

In the photomask 1214, on the surface of the light-transmissive substrate 1211 at the light source side is formed a predetermined light-shielding pattern 1212, and on the surface of the light-transmissive substrate 1211 at the sample substrate side is formed the light absorbing member 1213 having the same pattern as the light-shielding pattern 1212.

Also in the pattern formation apparatus by use of the selective irradiation light in which the photomask 1214 is employed, the light reflected on the above sample substrate is absorbed at the above light absorbing member 1213, whereby the same effect is obtained as when the photomask 1224 shown in FIG. 14 is employed.

Next, an example of a preferable apparatus to which the process of the present invention as described above is applied is described in more detail by referring to the drawings.

Figure 16:
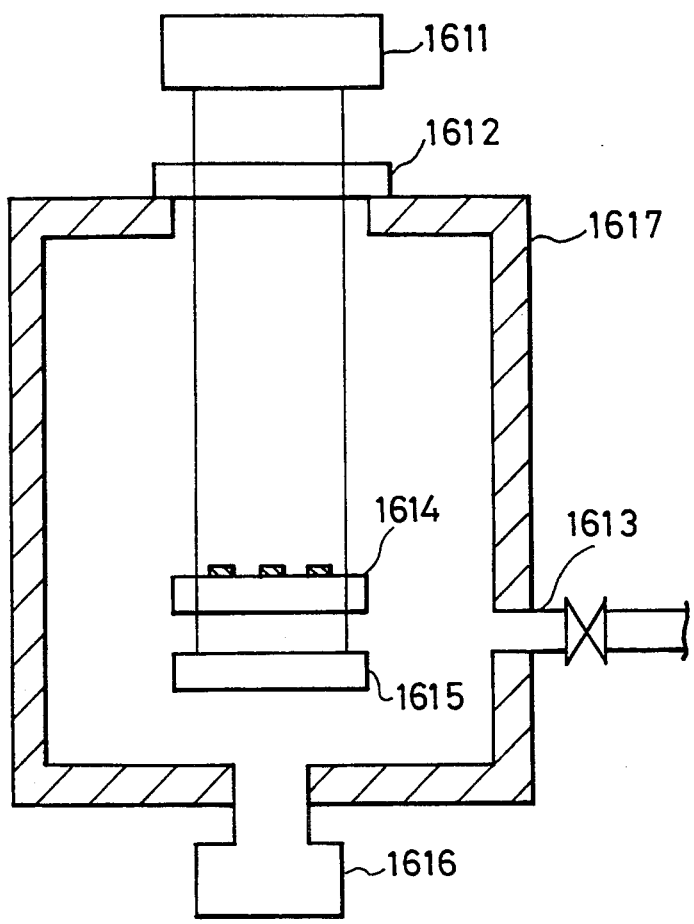
FIG. 16 is a schematic sectional view of one example of the preparation apparatus of the present invention.

FIG. 16 is a schematic sectional view showing the constitution of an example of the present invention.

This example, as shown in FIG. 16, consists of the treatment vessel 1617 provided with the light source 1611, the window 1612, the gas introducing pipe 1613 and the evacuation device 1616 and the supporting means (not shown) for supporting the photomask 1614 set within the treatment vessel 1617 in parallel and proximate to the sample to be treated 1615.

Into the chamber of the treatment vessel 1617 is introduced a predetermined gas from the gas introducing pipe 1613, and the pressure is maintained at a predetermined value by the evacuation device 1616. The light emitted from the light source 1611 transmits through the window 1612, and selectively transmits through the photomask 1614 to selectively irradiate the sample to be treated 1615. The region of the sample to be treated 1615 where the light is selectively irradiated is photoetched or an etching resistant portion is formed to form a predetermined pattern on the surface of the sample to be treated 1615.

Figure 17:
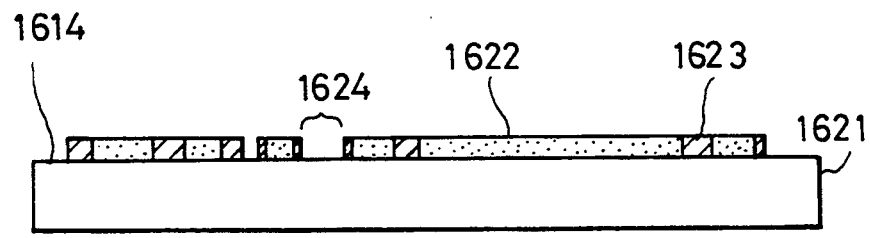
FIG. 17 and FIG. 18 are respectively schematic sectional views of preferable examples of the photomask 1614 and the sample to be treated 1615 in FIG. 16.
Figure 18:
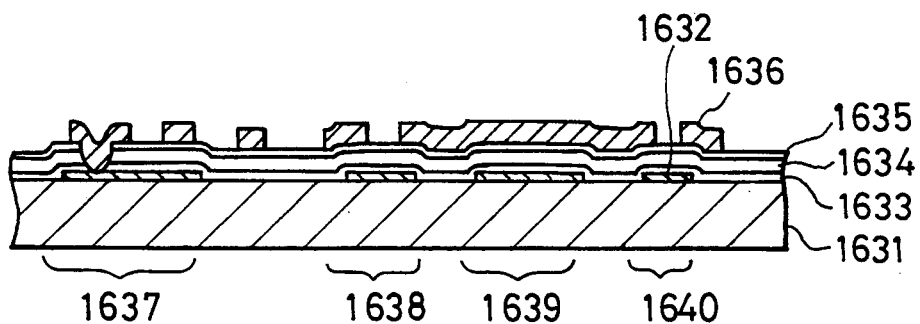

FIG. 17 and FIG. 18 are schematic sectional views respectively illustrating one example of specific constitutions of the photomask 1614 and the sample to be treated 1615, when preparing an Si image sensor.

The photomask 1614 has the light-shielding film 1622 and the light semitransmissive portion 1623 provided partially on the glass substrate 1621 as shown in FIG. 17, and the portion where these are not provided becomes the light-transmissive portion 1624. Thus, the light semitransmissive portion where the light semitransmissive membrane is provided has a desired light transmittance between that of the light-shielding portion where the light-shielding film is provided and that of the light-transmissive portion. The light-shielding film 1622 and the light semitransmissive membrane 1623 are provided corresponding to the etching pattern of the sample to be treated 1615.

The sample to be treated 1615, as shown in FIG. 18, has Cr electrodes 1632 with a thickness of 1000 Å provided at a plurality of places on the glass substrate 1631. Then, the SiN film 1633 with a thickness of 3000 Å, the Si film 1634 with a thickness of 6000 Å and the n+-Si film 1635 with a thickness of 1500 Å laminated successively thereon, and a plurality of Al electrodes 1636 provided at the upper portions corresponding to the respective Cr electrodes 1632. The respective electrode portions, as shown in FIG. 17, are made the matrix wiring portion 1637, the sensor portion 1638, the condenser portion 1639 and the TFT portion 1640 successively from the left.

Next, the photoetching actuation in this example is described.

Figure 19:
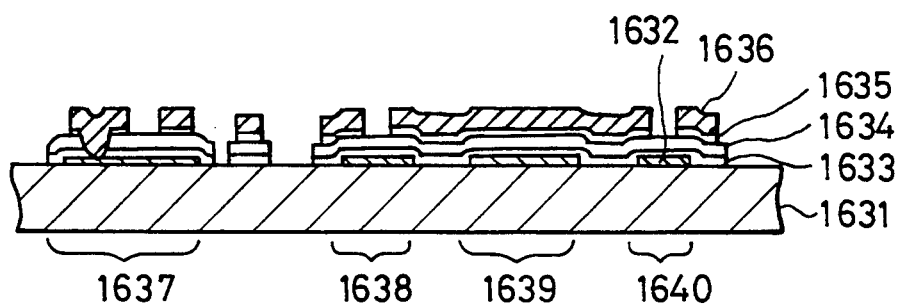
FIG. 19 is a schematic sectional view showing the state where the sample to be treated 1615 in FIG. 16 is photoetched.

After evacuation internally of the treatment vessel 1617 through the evacuation device 1616, $Cl_2$ gas is introduced through the gas introducing pipe 1613. Subsequently, the photoetching of irradiating XeCl laser which is the light source 1611 through the photomask 1614 to the sample to be treated 1615 is carried out for about 20 minutes. As the result, the portion corresponding to the light-transmissive portion 1624 is subjected to more photoetching than the portion corresponding to the light semitransmissive membrane 1623, while the portion corresponding to the light-shielding film 1622 is not subjected to photoetching, whereby a device can be prepared wherein the matrix wiring 1635, the sensor portion 1638, the condenser 1639 and the TFT portion 1640 are insulated from one another as shown in FIG. 19.

Thus, the device prepared by photoetching performed twice in the phototreatment apparatus of the prior art can be prepared in one step in this example by selectively irradiating the lights with different intensities by use of the photomask 1614 as described above to the sample to be treated 1615.

Next, another example is described.

Figure 20:
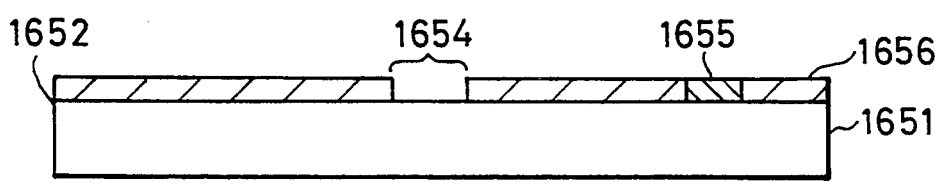
FIG. 20 is a schematic sectional view showing the constitution of another example of the photomask of the present invention.

This example performs film formation according to the optical CVD method by use of one shown in FIG. 20 as the photomask 1652.

As the sample to be treated 1615 for preparation of the Si image sensor, it is desirable that the thickness of the Si film 1634 formed on the SiN film 1633 (see FIG. 18) should be made 10000 Å on the sensor portion 1639, 3000 Å on the TFT portion 1640, and 6000 Å at other portions than these. For obtaining the Si film 1634 as described above, in this example, one shown in FIG. 20 is used as the photomask 1652, and one shown in FIG. 18 having the films up to the SiN film 1633 is used as the sample to be treated 1615.

The photomask 1652 shown in FIG. 20 comprises the light semitransmissive film 1655 provided at the portion corresponding to the TFT portion 1640 on the glass substrate 1651, making the portion corresponding to the sensor portion 1638 the light-transmissive portion 1654 provided with nothing, and other portions provided with the light semitransmissive film 1656. In this example, an ArF laser is used as the light source 1611, but the intensity of the laser beam passing respectively through the respective light semitransmissive films 1655 and 1656 is attenuated to 30% and 60% of that passed through the light-transmissive portion, respectively. The optical CVD is performed by permitting $SiH_4$ gas to flow in through the gas introducing pipe 1613 after evacuation of the treatment vessel 1617 by the evacuation device 1616 and irradiating the light emitted from the light source 1611 through the photomask 1652 to the sample to be treated 1615. Since the photomask 1652 is constituted as described above, to the SiN film 1633 of the sample to be treated 1615 are irradiated lights with greater intensities in the order of the portion corresponding to the light-transmissive portion 1654 (sensor portion 1639), the portion corresponding to the light semitransmissive film 1656, the portion corresponding to the light semitransmissive film 1655 (TFT portion 1640), whereby Si films 1634 with desired film thicknesses at the respective portions made are deposited on the SiN film 1633.

Formation of a film with different film thicknesses on the respective portions as described above required plural times of optical CVD by use of different photomasks (three times in the case of forming one of this example), but in this example, since lights with different intensities are irradiated by use of the photomask 1614 as described above, the film can be formed in one step.

Among the respective examples as described above, description has been made by referring to photoetching in the example by use of the photomask in FIG. 17, and by referring to the respective optical surface treatments of film formation in the example by use of the photomask in FIG. 20. However, as the optical surface treatment, otherwise there is also the surface modification treatment which forms different substances on the surface by photoirradiation, and also the surface modification treatment can be practiced by use of the constitution of the present invention as a matter of course.

The present invention is described in more detail by referring to Examples.

EXAMPLE 1

A material to be worked having an Al film with a thickness of 1500 Å formed on a silicon wafer as the substrate according to the sputtering method was set at the setting position of the material to be worked in the apparatus shown in FIG. 4.

Next, after vacuum evacuation internally of the vacuum tank 402 by an evacuation device 403 to $10^{-6}$ Torr or lower, argon gas was permitted to flow in at 20 SCCM, and the plasma generators 405 and 405', were actuated to generate a plasma, and the material to be worked was exposed in the atmosphere of the plasma generated for 20 minutes, and the Al film surface was cleaned by removing the Al oxide film and the adherents, etc. therefrom. Then, the vacuum tank 402 was internally vacuum evacuated to $10^{-6}$ Torr or lower.

Next, $NO_2$ gas was permitted through the gas introducing pipe 404 into the vacuum tank at 200 SCCM, and by use of an ArF excimer laser (wavelength 193 nm) as the light source 406, a pattern exposure was effected through the exposure mask 408 for formation of a desired exposure pattern at a laser oscillation frequency of 50 Hz for 5 minutes.

Then, chlorine gas for etching was permitted to flow in through the gas introducing pipe 417 at 500 SCCM, excited by the magnetron 418 to form chlorine radicals, which were introduced through the transporting pipe 420 into the vacuum tank 402, and etching treatment was carried out under such a state for 10 minutes.

After completion of etching, the material to be worked was taken out from the apparatus, and its surface was observed. As the result, etching was not seen at the photoirradiated portion, and the silicon wafer which is the substrate exposed at the non-irradiated portion was also etched.

EXAMPLE 2

After a polysilicon film (film thickness 4000 Å) was formed on a silicon wafer as the substrate according to the CVD method, subsequently in the same vacuum tank, hydrogen ions generated from hydrogen gas according to the ECR plasma method at a vacuum degree of $10^{-3}$ Torr or less were irradiated to the above polysilicon film to effect its surface modification.

The material to be worked thus obtained was set at the setting position of the material to be worked in the apparatus shown in FIG. 5.

Next, after the vacuum tank 402 was internally vacuum evacuated to $10^{-6}$ Torr or less, $NO_2$ gas was permitted to flow in through the gas introducing pipe 404 into the vacuum tank 402 at 100 SCCM, and by use of an argon ion laser as the laser beam source 410, continuous irradiation was effected under the conditions of an output of 1 W, a spot diameter of 50 μm, a parallel scanning speed of 20 cm/sec., and a delivery speed of the material to be worked of 2 mm/sec. to form a stripe-shaped irradiated pattern on the polysilicon film surface of the material to be worked.

Then, $NF_3$ gas for etching was permitted to flow in through the gas introducing pipe 417 at 800 SCCM, excited by the magnetron 418 to form fluorine radicals, which were introduced through the transporting pipe 420 into the vacuum tank 402 to effect etching treatment in such a state for 3 minutes.

After completion of etching, the material to be worked was taken out from the apparatus, the etching depth at the etched position was measured by Taristep manufactured by Hobson-Taylor Company.

As the result, it is confirmed that the photoirradiated portion was not etched, but the non-irradiated portion was etched to have a depth of 2500 Å.

As the result of its surface observation, a pattern of continuous unevenness corresponding to the photoirradiated portion and the unirradiated portion arranged in a stripe was observed.

EXAMPLE 3

At the setting position of the material to be worked in the vacuum tank 402 in the apparatus shown in FIG. 5, gases of $SiH_4$ 20 SCCM, $NH_3$ 500 SCCM and $H_2$ 180 SCCM were permitted to flow through the gas introducing pipe 404 into the vacuum tank 402 and mixed, and by actuation of the plasma generators 405 and 405', an amorphous silicon nitride film (a-SiN:H film) was formed with a thickness of 5000 Å on the substrate heated to 300° C. to form a material to be worked.

The material to be worked was subjected subsequently to formation of an etching pattern as described below in the state set in the vacuum tank 402, namely without contact with air such as by taking it out of the apparatus.

Next, after the vacuum tank was internally vacuum evacuated to $10^{-6}$ Torr or less, $NO_2$ gas was permitted to flow in through the gas introducing pipe 404 into the vacuum tank 402, and by use of an argon ion laser as the laser beam source 410, continuous irradiation was effected under the condition of an output of 1 W, a spot diameter of 50 μm, a parallel scanning speed of 20 cm/sec. and a delivery speed of the material to be worked of 2 mm/sec. to form a stripe-shaped irradiated pattern on the polysilicon film surface of the material to be worked.

Then, $Cl_2$ gas 200 SCCM and $NF_3$ gas 100 SCCM for etching were permitted to flow in through the gas introducing pipe 417, and these were excited by the magnetron 418 to form chlorine and fluorine radicals, which were introduced through the transporting pipe 420 into the vacuum tank 402 to effect etching treatment in such a state for 10 minutes.

After completion of etching, the material to be worked is taken out from the apparatus, and the etching depth of the etched portion was measured by Taristep manufactured by Hobson-Taylor Company.

As the result, it was confirmed that the photoirradiated portion was not etched, but the non-irradiated portion was etched with a depth of 3000 Å.

As the result of its surface observation, a pattern of continuous unevenness corresponding to the photoirradiated portion and the unirradiated portion arranged in a stripe was observed.

Further, when the dielectric constant and dielectric breakdown voltage of the a-SiN:H film (the portion remaining without etching) subjected to the surface modification in the procedure of this Example were measured, the dielectric constant was found to be 7.0, unchanged as before the modification, while the dielectric breakdown voltage was improved by about 1.5-fold as 6 MV/cm as compared with that before the modification.

EXAMPLE 4

By utilizing the process of the present invention, a TFT was prepared according to the procedure as described below. The outline of the steps is shown in FIGS. 21A to 21G.

Figure 21A:
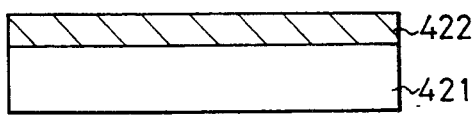
FIGS. 21A to 21G are step illustrations showing the preparation steps of FET.

First, on a glass substrate 421, an amorphous silicon film 422 (film thickness 5000 Å) was formed by plasma decomposition of $SiH_4$ by use of the plasma CVD method at a substrate temperature of 250° C. (FIG. 21A).

Figure 21B:
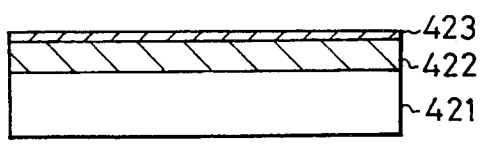

Next, in the same vacuum region, the gas mixture of $SiH_4$ and $PH_3$ was plasma decomposed according to the plasma CVD method to form a film of an amorhous silicon n+-layer 423 (film thickness 1000 Å) at a substrate temperature of 250° C. (FIG. 21B).

Figure 21C:
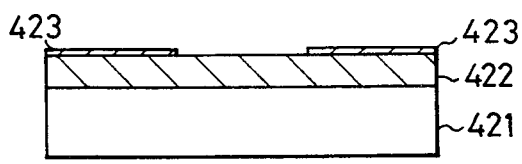
Figure 21D:
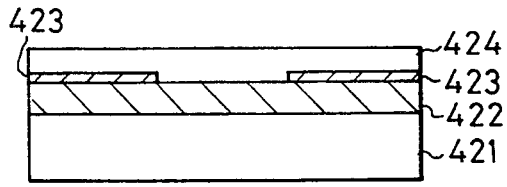

Further, the substrate at the stage having formed the layer 423 was set in the apparatus shown in FIG. 5, and after cleaning of the surface in the same manner as in Example 2, the layer 423 was subsequently etched to a desired pattern in the same apparatus (FIG. 21C).

Figure 21E:
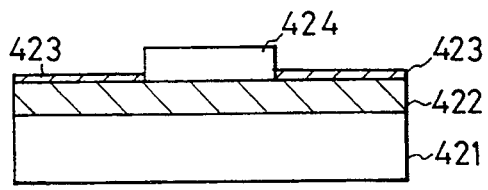
Figure 21F:
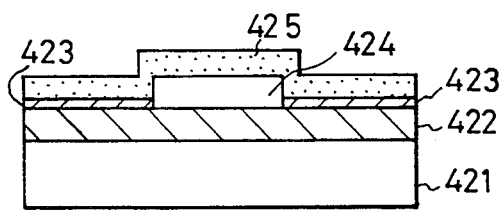

On the substrate surface including the layer 423 formed in a pattern, an a-SiN:H film 424 (film thickness 4000 Å) was formed in the same manner as in Example 3 (FIG. 21D), and further subsequently, the surface modification and the etching treatment were effected in the same manner as in Example 3 (FIG. 21E).

Figure 21G:
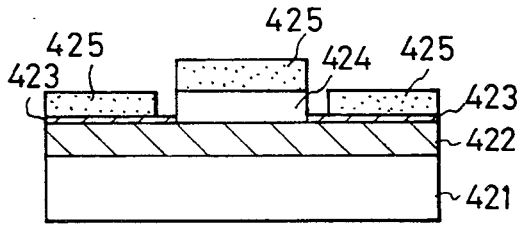

Finally, as described in Example 1, an Al film 425 (film thickness 3000 Å) was formed according to the sputtering method (FIG. 21F), set in the apparatus in FIG. 4, subjected to cleaning of the surface, photoirradiation and to etching treatment similarly as in Example 1 and then taken out from the apparatus to obtain an FET (FIG. 21G).

The site selective exposure for the respective etching steps as described above controlled the pattern of the exposure mask and the scanning conditions of the laser beam, etc. so that the channel width of the FET prepared may be 25 μm and the channel length 10 μm.

Dependency of the drain current $I_D$ of the obtained TFT on the drain voltage $V_D$ was examined. The results are shown in FIG. 22.

Figure 22:
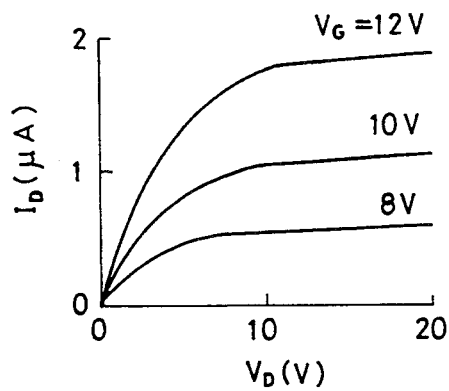
FIG. 22 is a graph showing the dependency of drain voltage $V_D$ on the drain current $I_D$ in the FET prepared in Example 4.

As is apparent from the results in FIG. 22, the TFT obtained in this Example was found to have good characteristics with little trap site under the gate channel.

EXAMPLE 5

After a material to be worked was obtained by forming an amorphous silicon film with a film thickness of 4000 Å on a silicon wafer as the substrate according to the CVD method at a substrate temperature of 250° C., hydrogen gas was ionized by use of the ECR plasma method at a vacuum degree of $10^{-3}$ Torr or less, and irradiated to the amorphous silicon film surface formed on the material to be worked, thereby effecting the surface modification.

Next, the material to be worked was set at the setting position of the material to be worked in the apparatus shown in FIG. 5.

After vacuum evacuation internally of the vacuum tank to $10^{-6}$ Torr or less, $CF_4$ gas was permitted to flow in through the gas introducing pipe 417 at 500 SCCM and a power of 700 W was thrown by the magnetron 418 to excite microwaves, which were introduced through the transporting pipe 420 into the vacuum tank 402 to form a polymerized film on the amorphous silicon film of the material to be worked. The gas pressure during the operation was 0.25 Torr, and the film formation time 2 minutes.

Next, $NO_2$ gas was permitted to flow in through the gas introducing pipe 404 at 100 SCCM, and by use of an argon ion laser as the laser beam source 410, continuous irradiation was effected under the conditions of an output of 1 W, a spot diameter of 50 μm, a parallel scanning speed of 20 cm/sec. and a delivery speed of the material to be worked of 2 mm/sec., and the polymerized film at the photoirradiated portion was selectively removed by decomposition with oxygen radicals formed by photoexcitation to obtain a state in which the resist pattern comprising a band-shaped polymerized film and the exposed portion of an amorphous silicon film juxtaposed in stripes.

When unnecessary gas, etc. was removed from within the vacuum tank 402 by the evacuation device 403, $Cl_2$ was introduced at 800 SCCM through the gas introducing pipe 417, a microwave was excited by the magnetron 418 to form chlorine radicals, which were introduced through the transporting pipe 420 into the vacuum tank 402, followed by etching treatment of the surface where the resist pattern of the amorphous silicon film was provided for 5 minutes.

After completion of the etching treatment, oxygen gas was introduced through the gas introducing pipe 404 to generate a plasma from the plasma generators 405 and 405', thereby effecting ashing of the polymerized film to remove the resist pattern comprising the polymerized film on the surface of the amorhous silicon film subjected to the etching treatment.

After completion of the steps as described above, the material to be worked was taken out from the vacuum tank, and the etching depth of the etched portion was measured by Taristep manufactured by Hobson-Taylor Company.

As the result, it was confirmed that the non-irradiated portion was not etched, but the irradiated portion was etched with a depth of 3000 Å.

Also, as the result of the surface observation, a continuous uneven pattern corresponding to the photoirradiated portion and the unirradiated portion arranged in stripes was observed.

EXAMPLE 6

On a silicon wafer as the substrate, an n+ type amorphous silicon film was formed with a thickness of 1500 Å to obtain a material to be worked.

The material to be worked was set in the setting position of the material to be worked in the apparatus shown in FIG. 5.

Next, similarly as described in Example 5, a polymerized film was formed on the n+ type amorphous silicon film, and further by use of a $CO_2$ laser as the laser beam source 410, continuous irradiation was effected under the conditions of an output of 8 W, a spot diameter of 15 μm, a parallel scanning speed of 20 cm/sec. and a delivery speed of the material to be worked of 2 mm/sec., whereby the polymerized film was removed by pyrolysis to obtain a resist pattern comprising the polymerized film remaining on the non-irradiated portion.

Further, the etching treatment of the material to be treated was carried out in the same manner as in Example 1 except for changing the etching treatment time to one minute, followed further by ashing treatment.

After completion of the steps as described above, the material to be worked was taken out from the vacuum tank, and the etching depth of the portion subjected to etching similarly as in Example 5 was measured, whereby the photoirradiated portion was confirmed to be etched with a depth of 1400 Å.

Further, as the result of its surface observation, a continuous uneven pattern corresponding to the photoirradiated portion and unirradiated portion arranged in stripes was observed.

EXAMPLE 7

A material to be worked was obtained by forming an Al film with a thicknes of 2000 Å on a silicon wafer as the substrate according to the sputtering method.

The material to be worked was set at the setting position of the material to be worked in the apparatus shown in FIG. 4, the vacuum tank was placed under a vacuum degree of $10^{-6}$ Torr or lower, an argon gas permitted to flow through the gas introducing pipe 404 into the vacuum tank 402 at 20 SCCM to generate a plasma from the plasma generators 405 and 405', and the Al film of the material to be worked was exposed to the plasma atmosphere generated for 20 minutes, thereby cleaning its surface.

Next, $CF_3Cl$ gas was permitted to flow in through the gas introducing pipe 417 at a flow rate of 500 SCCM and a power of 700 W applied by the magnetron 418 to excite microwaves, which were introduced through the transporting pipe 420 into the vacuum tank 402 to form a polymerized film on the Al film of the material to be worked.

Next, oxygen gas was permitted to flow through the gas introducing pipe 404 at 100 SCCM, and by use of an ArF excimer laser as the light source 406, pattern exposure was effected at a laser oscillation frequency of 50 Hz through an exposure mask 408 for 5 minutes.

Then, $Cl_2$ gas was introduced as the gas for etching through the introducing pipe 417 at 500 SCCM, excited by the magnetron 418 to form chlorine radicals, which were introduced through the transporting pipe 420 into the vacuum tank 402 and etching treatment was carried out for 10 minutes.

After completion of the etching treatment, the material to be worked was taken out from the vacuum tank, and its surface was observed. As the result, at the portion photoirradiated through the exposure mask, the Al film was found to be etched to expose the silicon wafer of the substrate, while the Al film protected with the polymerized film remains without etching at the non-irradiated portion.

EXAMPLE 8

By use of the process for forming an etching pattern of the present invention, the preparation of a photosensor comprising amorphous silicon was carried out as described below. The procedures are shown in FIGS. 23A to 23E.

Figure 23A:
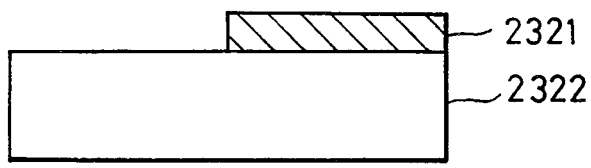
FIGS. 23A to 23E are step illustrations showing the preparation steps of the photosensor of the present invention.
Figure 23B:
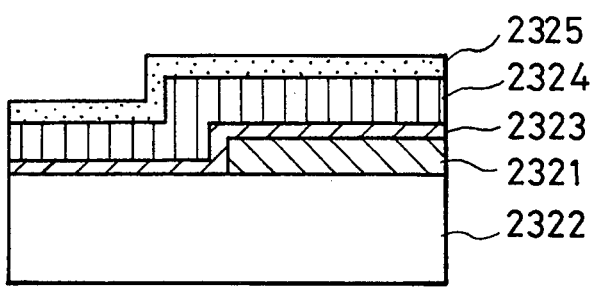

First, as shown in FIG. 23A, on a glass substrate 2322 attached with an ITO electroconductive film 2321 previously applied with pattern formation, according to the plasma CVD method, a gas mixture composed of $SiH_4$ gas, $NH_3$ gas and $H_2$ gas at a desired mixing ratio was plasma decomposed, and within the same vacuum region, an amorphous silicon nitride film 2323 was formed with a thickness of 100 Å at a substrate temperature of 300° C. Further an amorphous silicon film 2324 with a thickness of 4000 Å at a substrate temperature of 250° C. and an n+-amorphous silicon film 2325 with a thickness of 1500 Å at the same substrate temperature were continuously formed in this order (FIG. 23B).

Figure 23C:
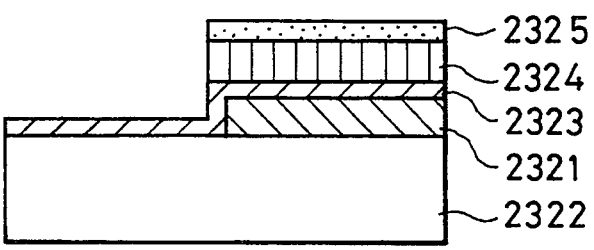
Figure 23D:
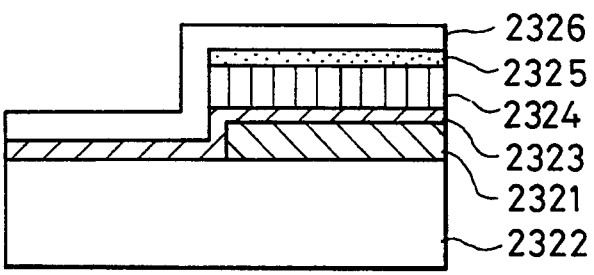

Next, according to the same procedure as in Example 6, the cleaning treatment of the surface of the n+-amorphous silicon film 2325, formation of the polymerized film, patterning of the polymerized film, and etching treatment were carried out to etch the portions not covered with the resist pattern of the amorphous silicon film 2324 and the n+-amorphous silicon film 2325 (FIG. 23C).

Figure 23E:
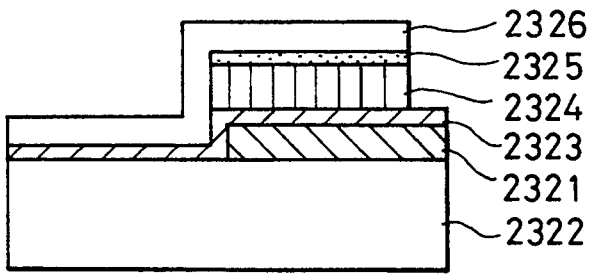

Further, similarly as described in Example 7, formation of an Al film 2326 (thickness, 2000 Å) (FIG. 23D), cleaning of its surface, formation of the polymerized film, patterning of the polymerized film and etching treatment (treatment time 15 minutes) were carried out to obtain an MIS type photosensor (FIG. 23E).

EXAMPLE 9

Referring to the apparatus described in FIGS. 6 to 11, the preparation procedures of this Example in preparing an FET are described.

FIG. 24A to FIG. 24G are each a schematic sectional view showing the structure of the grown film in each preparation step. The quarty plate 671 shown as the sample 608 in FIGS. 6 to 11 was placed through the gate valve 607a into the loadlock chamber 601, and the loadlock chamber 60 1 was internally vacuum evacuated to $10^{-6}$ Torr or lower by means of a vacuum evacuation device (not shown). In the following, the sample 608 is called hereinafter as the quartz plate 671. The quartz plate 671 may be also called as such, also including the case when a deposited film was provided on the quartz plate 671. The conveying chamber 610 was evacuated constantly by means of a vacuum evacuation device (not shown) to be maintained at a pressure of $10^{-6}$ Torr or lower. The gate valve 607b was opened, the quartz substrate 671 which is a sample was received by the conveyor 609, placed in the conveying chamber 601 and the gate valve 607b was closed.

As the next step, the cleaning chamber 602 was previously vacuum evacuated internally to $10^{-7}$ Torr or lower by means of a vacuum evacuation device (not shown), the gate valve 607c was opened and the quartz substrate 608 was mounted by the conveyor 609 on the sample holding stand 622 in the cleaning chamber 602, followed by closing the gate valve 607c. The cleaning chamber 602 was vacuum evacuated internally to $10^{-7}$ Torr or lower by a vacuum evacuation device (not shown). Through the gas introducing inlet 621, a gas for cleaning of the surface of the quartz substrate 671, Ar 50 SCCM in this case, was introduced into the cleaning chamber 601, and the operation of the vacuum evacuation device (not shown) was controlled to a pressure of 0.08 Torr in the cleaning chamber 602.

Next, a high frequency of 13.56 MHz and 100 W was applied to the sample holding stand 622 while controlling the matching box 626 to generate a plasma in the space between the sample holding stand 622 and the counter-electrode 623. The sample holding stand 622 was insulated direct-currently by the condenser (not shown) within the matching box 626, and therefore the sample holding stand 622 generates a negative direct current bias voltage of about −60 V from the difference in mobility between electrons and ions, by which the voltage Ar ions were accelerated to be impinged to the surface of the quartz substrate 671 and remove the contamination on the surface by sputtering, thus giving a clean surface. The treatment time was about 600 sec. Feeding of the gas was stopped after completion of the treatment, and the cleaning chamber 602 was vacuum evacuated to an internal pressure of $10^{-7}$ Torr or lower. The gate valve 607c was opened, the quartz substrate 671 was taken out by the conveyor 609, the gate valve 607c was closed and the cleaning chamber 602 was again vacuum evacuated so as to maintain an internal pressure of $10^{-7}$ Torr or lower.

Next, the plasma film forming chamber 604 was vacuum evacuated internally to $10^{-7}$ Torr or lower by a vacuum evacuation device (not shown). Subsequently, the gate valve 607e was opened, the quartz substrate 671 was introduced into the plasma film forming chamber 604 by the conveyor 609 and placed on the sample holding stand 642 previously heated to 250° C. by a heater (not shown), followed by closing of the gate valve 607e. Then, the plasma film forming chamber 604 was internally vacuum evacuated to $10^{-7}$ Torr or lower by a vacuum evacuation device (not shown), and the quartz substrate 671 was heated to a temperature of 250° C.

Next, $SiH_4$ was introduced at 100 SCCM and $H_2$ at 740 SCCM through the gas introducing inlet 641 into the plasma forming chamber 604 to control the operation of the vacuum evacuation device (not shown) so that the pressure of the plasma film forming chamber 604 may become 0.5 Torr. A high frequency of 13.56 MHz and 100 W was applied to the counter-electrode 643 while controlling the matching box 646 to generate a plasma in the space between the sample holding stand 642 and the counter-electrode 643 to effect plasma decomposition of the introduced gas, thereby depositing an amorphous silicon (a-Si) film 672 thereon to 5000 Å (see FIG. 24A). After film formation, the gas introduced was stopped and vacuum evacuation effected to 10 Torr or lower internally of the plasma film forming chamber 604, and thereafter $SiH_4$ was introduced at 20 SCCM, $H_2$ at 80 SCCM, $PH_3$ at 400 SCCM through the gas introducing inlet 641 into the plasma film forming chamber 604 to control the operation of the vacuum evacuation device (not shown) so that the pressure of the plasma film forming chamber 604 may become 0.5 Torr.

Figure 24A:
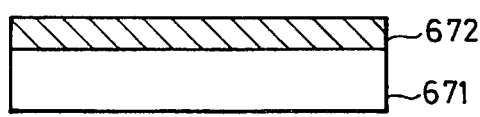
FIGS. 24A to 24G are respectively illustrations for stepwise explaining the preparation steps during preparation of a semiconductor device by the present invention.
Figure 24B:
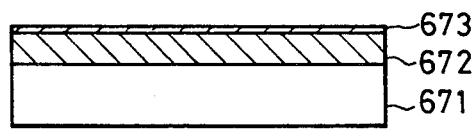
Figure 24C:
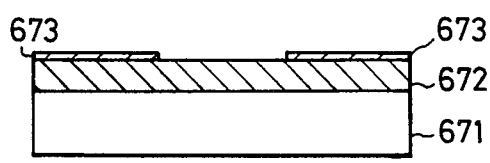
Figure 24D:
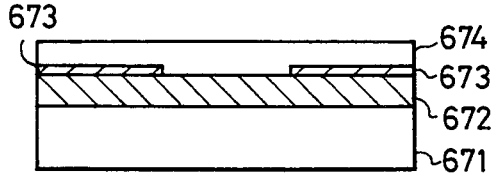

Next, a high frequency of 13.56 MHz and 300 W was applied to the counter-electrode 643 while controlling the matching box 646 to generate a plasma in the space between the sample holding stand 642 and the counter-electrode 643 and effect plasma decomposition of the introduced gas, thereby depositing an n+-amorphous silicon (n+-Si) film 673 to 1000 Å (see FIG. 24B). After film formation, the introduced gas was stopped, the plasma film forming chamber 604 vacuum was evacuated internally to $10^{-7}$ Torr or lower, the quartz substrate 671 was taken out by the conveyor 609 by opening the gate valve 607e, the gate valve 607e was closed, and the plasma film forming chamber 604 was vacuum evacuated so as to maintain an internal pressure of 10 Torr or lower.

Next, the gate valve 607g of the latent image chamber 606 previously evacuated to 10 Torr by a vacuum evacuation device (not shown) was opened, the quartz substrate 671 was introduced by the conveyor 609 into the latent image chamber 606 and mounted on the sample holding stand 662, and the gate valve 607g was closed. Subsequently, the latent image chamber 606 was internally vacuum evacuated by a vacuum evacuation device (not shown) to 10 Torr or lower. $NO_2$ gas was introduced through the gas introducing inlet 662 into the latent image chamber 606 to control the vacuum evacuation device so that the internal pressure may become 1 Torr. Subsequently, a laser beam with a wavelength of 248 nm oscillated by a KrF excimer laser which is the light source 663 was irradiated uniformly by the illumination optical system 664 to the mask 665 on which a pattern for formation of a channel (channel width: 25 μm, channel length: 10 μm) had been formed, and the pattern image of the mask 665 formed through the window 667 onto the surface of the n+-Si film 673 on the quartz substrate by the projection optical system 666. As the material of the window 667, quartz was employed for permitting the laser beam with the wavelength of 248 nm so as to be not absorbed but transmitted. On the surface of the n+-Si film 673 where the mask image was formed, $NO_2$ and Si caused the photochemical reaction only at the portion where the light was irradiated, to form an $SiO_x$ layer with a thickness of about 20 Å (not shown) on the n+-poly-Si surface by exposure for 10 minutes. At the portion where light was not irradiated, such reaction was not proceeded, and consequently a negative pattern of the mask is formed on the surface of the n+-Si film 673. In other words, the n+-Si film 673 was modified to $SiO_x$ and a latent image was formed. As the light source 663, a KrF excimer laser was employed here, the lamp light sources such as a xenon lamp, low pressure mercury lamp, high pressure mercury lamp, etc. and UV-ray lasers such as an ArF excimer laser, XeCl excimer laser, Ar laser, etc. have also the same effects.

After formation of the latent image as described, the gas introduced was stopped, the latent image chamber 606 internally was vacuum evacuated to $10^{-7}$ Torr or lower, the gate valve 607g was opened, the quartz substrate 671 was taken out by the conveyor 609 and the gate valve 607g was closed. Then, the latent image chamber 606 was vacuum evacuated again so as to maintain the internal pressure at $10^{-7}$ Torr or lower.

Next, the gate valve 607f of the etching chamber 605 previously evacuated by a vacuum evacuation device (not shown) to $10^{-7}$ Torr was opened, the quartz substrate 671 was introduced by the conveyor 609 into the etching chamber 605 and mounted on the sample holding stand 652, followed by closing of the gate valve 607f. Then, the etching chamber 605 was vacuum evacuated internally to $10^{-7}$ Torr or lower by a vacuum evacuation device (not shown). Subsequently, through the gas introducing inlet 651, introduced was a gas for etching the n+-Si film 673 applied with the latent image, $Cl_2$ at 500 SCCM in this case, into the microwave plasma gas excitation device 653 to control the operation of a vacuum evacuation device (not shown) so that the pressure in the etching chamber 605 may become 0.25 Torr. Subsequently, the microwave of 2.45 GHz and 700 W generated by a microwave generating device (not shown) was supplied to the microwave plasma gas excitation device 653, and the excited molecules $Cl_2^*$ and $Cl^*$ excited by plasma formation of the etching gas were supplied into the etching chamber 605 through the transporting pipe 654 which is made of quartz with a whole length of 20 cm and an inner diameter of 40 mm. With an $SiO_2$ layer having a latent image pattern on the surface of the excited molecule n+-Si film 673 reaching the quartz substrate 671 as the mask, a chlorine compound which is a volatile substance was generated through the reaction with the n+-Si film 673, whereby the n+-poly-Si film was etched to form a channel (see FIG. 24C). Then, the gas introduced was stopped, and the etching chamber was internally vacuum evacuated to $10^{-7}$ Torr or lower, the gate valve 607f was opened, the quartz substrate 671 was taken out by the conveyor 609, the gate valve 607f was closed and the etching chamber 605 again internally vacuum evacuated so as to maintain a pressure of $10^{-7}$ Torr or lower.

Next, the gate valve 607e of the plasma film forming chamber 604 with the internal pressure already made to $10^{-7}$ Torr or lower was opened, the quartz substrate 671 was introduced into the chamber by the conveyor 609 and mounted on the sample holding stand 642 previously heated to 350° C. by a heater (not shown) and then the gate valve 607e was closed. Subsequently, the plasma film forming chamber 604 was internally vacuum evacuated to $10^{-7}$ Torr or lower by a vacuum evacuation device (not shown) and heated until the temperature of the quartz substrate 671 may become 350° C. Through the gas introducing inlet 641, $SiH_4$ at 13 SCCM, $H_2$ at 120 SCCM, and $NH_3$ at 360 SCCM were introduced into the plasma film forming chamber 604, and the operation of a vacuum evacuation device (not shown) was controlled so that the pressure of the plasma film forming chamber may become 0.5 Torr. A high frequency of 13.56 MHz and 80 W was applied to the counter-electrode 643 while controlling the matching box 646 to generate a plasma in the space between the sample holding stand 642 and the counter-electrode 643 and effect plasma decomposition of the introduced gas, thereby depositing an amorphous silicon nitride (a-SiN) film 674 to 4000 Å (see FIG. 24D). After the film formation, the introduced gas was stopped, the plasma film forming chamber 604 was internally evacuated to $10^{-7}$ Torr or lower, then the gate valve 607e was opened, the quartz substrate 671 was taken out by the conveyor 609, the gate valve 607e was closed, and the plasma film forming chamber 604 was again vacuum evacuated so as to maintain the internal pressure of $10^{-7}$ Torr or lower.

Next, the gate valve 607g was opened, the quartz substrate 671 introduced into the latent image chamber 606 by the conveyor 609 and mounted on the sample holding stand 662, the gate valve 607g was closed to prepare a latent image of $SiO_x$ film on the a-SiN film 674, which is the same as the latent image film for channel formation formed on the $n^+$-Si film 673 as described above, on the same position.

Figure 24E:
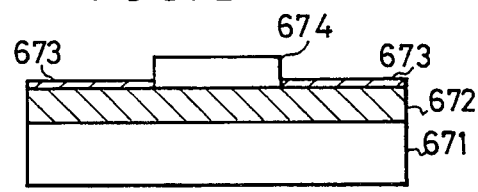
Figure 24F:
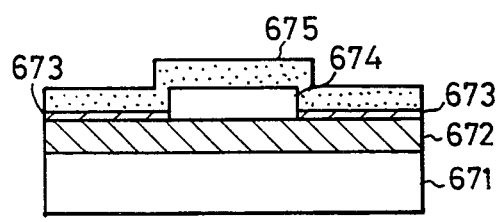

Next, the a-SiN film 674 was etched with the latent image as the mask to form a gate insulating film, and as the etching gas, $Cl_2$ at 900 SCCM and $NF_3$ at 100 SCCM were fed through the gas introducing inlet 651 to effect etching of the a-SiN film 674 similarly as the $n^+$-Si film 673 (see FIG. 24E). Then, the above introduced gas was stopped, the etching chamber 605 was internally vacuum evacuated to $10^{-7}$ Torr or lower, the gate valve 607f was opened, the quartz substrate 671 was taken out by the conveyor 609, the gate valve 607f was closed, and the etching chamber 605 was again vacuum evacuated so as to maintain the inner pressure at $10^{-7}$ Torr or lower.

Next, the gate valve 607d of the sputtering film forming chamber 603 previously vacuum evacuated internally to $10^{-7}$ Torr or lower by a vacuum evacuation device (not shown) was opened, the quartz substrate 671 was introduced into the sputtering film forming chamber 603 by the conveyor 609 and mounted on the sample holding stand 632, and the gate valve 607d was closed. Subsequently, the sputtering film forming chamber 603 was internally vacuum evacuated to $10^{-7}$ Torr or less by a vacuum evacuation device (not shown). Through the gas introducing inlet 631, Ar at 50 SCCM was introduced into the sputtering film forming chamber 603, and the operation of a vacuum evacuation chamber (not shown) was controlled so that the pressure in the sputtering film forming chamber 603 may become 0.05 Torr. A high frequency of 13.56 MHz and 500 W was applied on the counter-electrode 633 while controlling the matching box 636 to generate a plasma in the space between the sample holding stand 632 and the counter-electrode 633 and to effect plasma decomposition of the introduced gas, and the aluminum mounted as the sputtering metal 638 on the counter-electrode 633 was sputtered to deposit an Al thin film 675 to 4000 Å on the quartz substrate 671 (see FIG. 24F). After film formation of the Al thin film 675, the introduced gas was stopped, the sputtering film forming chamber 603 was internally vacuum evacuated to $10^{-7}$ Torr or lower, the gate valve 607d was opened, the quartz substrate 671 was taken out by the conveyor 609 the gate valve 607d was closed, and the sputtering film forming chamber 603 was again vacuum evacuated so as to maintain the internal pressure of $10^{-7}$ Torr or lower.

Next, the gate valve 607g was opened, the quartz substrate 671 was introduced by the conveyor 609 into the latent image chamber 606 and mounted on the sample holding stand 662, the gate valve 607g was closed, and a latent image layer for an electrode was prepared on the surface of the Al thin film 675 according to the same procedures as in the twice latent image forming steps as described above. However, the composition of the latent image formed here is $AlO_x$.

Figure 24G:
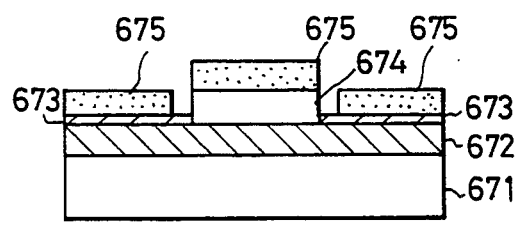

Next, the gate valve 607f was opened, the quartz substrate 671 was mounted on the sample holding stand 672, and the Al thin film was etched with the latent image layer as the mask according to the same procedures as the etching step as described above to form source, drain and gate electrodes (see FIG. 24G). As the etching gas, $Cl_2$ was fed at 1000 SCCM through the gas introducing inlet 651 to effect etching similarly as the $n^+$-Si film 673 and the a-SiN film 674 (see FIG. 24E). Then the introduced gas was stopped, the etching chamber 605 was internally vacuum evacuated to $10^{-7}$ Torr or lower, the gate valve 607f was opened, the quartz substrate 671 was taken out by the conveyor 609, the gate valve 607f was closed, the gate valve 607b was opened, the quartz substrate 671 was placed in the loadlock chamber 601, the gate valve 607b was closed, the internal pressure of the loadlock chamber 601 was returned internally to atmospheric pressure, and the quartz substrate having an FET formed thereon was taken out.

In the above-described Example, fine working was performed by use of a latent image etching process. Also the same effect can be obtained by use of photoetching. Photoetching can be practiced by use of the photolatent image chamber 606.

EXAMPLE 10

Next, as the tenth Example of the present invnetion, the process of forming an FET electrode by working an Al thin film 675 with a thickness of 4000 Å prepared in the Example as described above by photoetching is described.

In this Example, the latent image chamber 606 was used as the photoetching chamber.

The process for forming the Al thin film 675 with a thickness of 4000 Å by sputtering in entirely the same manner as in the above-described Example, and then the latent image chamber 606 was evacuated by a vacuum evacuation device (not shown) to $10^{-7}$ Torr or lower, the gate valve 607g was opened, the quartz substrate 671 was introduced by the conveyor 609 into the latent image chamber 606 and mounted on the sample holding stand 662, and the gate valve 607g was closed. Subsequently, by a vacuum evacuation device (not shown), the latent image chamber 606 was internally vaccum evacuated to $10^{-7}$ Torr or less.

Next, $Cl_2$ gas was introduced through the gas introducing inlet 662 into the latent image chamber 606, and the vacuum evacuation device controlled so that the internal pressure in the latent image chamber 606 became 0.1 Torr. In this state, a laser beam with a wavelength of 248 nm oscillated by a KrF excimer laser which is the light source 663 was irradiated through a nega-related mask with the shielding portion and the opening portion of the mask 665 for electrode formation used in the Example as described above to form an image as the mask image on the surface of the Al thin film 675 by the projection optical system 666. On the surface, only at the portion where the light was irradiated, Al and $Cl_2$ caused the photochemical reaction to effect photoetching. The steps thereafter were conducted in the same manner as in the foregoing Example. In etching of the $n^+$-Si film 673, fine working was carried out by use of $Cl_2$ as the photoetching gas. Also in photoetching of the a-SiN film 674, it was carried by use of $CF_4+H_2$ as the photoetching gas.

When the relationship between the drain current and the drain voltage of the a-Si thin film FET prepared according to the preparation process as described above was measured, good characteristics were exhibited because it was prepared according to a consistent process in vacuum without use of a resist, whereby the number of steps and the generation of dust was reduced to enable production with a good yield.

EXAMPLE 11

In the device shown in FIG. 13, an etching pattern was formed by use of a photomask having the constitution of the present invention shown in FIG. 12 as the photomask.

As the sample substrate 1205, one having $SiO_2$ deposited to 200 Å on a silicon substrate and an $n^+$-polysilicon to 3000 Å deposited thereon was used.

After evacuation internally of the treatment vessel 1210 by an evacuation device 1206 to $10^{-6}$ Torr or lower, $Cl_2$ gas was introduced through the gas introducing pipe 1207. The evacuation device 1206 was controlled so that the pressure in the treatment vessel 1210 became 1.0 Torr. Then, a laser beam was irradiated vertically on the photomask 1204 from the light source 1208 comprising an XeCl laser and an optical system.

Here, for the light-transmissive substrate 1201 of the above mentioned photomask 1204 and the light-transmissive window 1209 of the above-mentioned treatment vessel 1210, quartz plates were employed. For the light-shielding pattern 1202 of the above-mentioned photomask 1204, chromium, and for the light absorbing member 1203, carbon were employed, respectively.

In this Example, since the photomask 1204 with the constitution shown in FIG. 12 was employed, reflected light from the sample substrate 1205 did not return again to the sample substrate 1205, and therefore a pattern of etching of the polysilicon could be formed on the sample substrate 1205 with a good precision.

For comparison, an etching pattern was trially made similarly by use of the photomask 1224 of the prior art having only the light shielding pattern 1222 formed on the surface on the side of the light source 1208 of the light-transmitting substrate 1221 as shown in FIG. 14. As the result, when the photomask 1224 was employed, the reflected light from the sample substrate 1205 was reflected on the photomask 1224 and returned again to the substrate 1205, whereby an unfocused image occurred at the edge portion of the pattern of the etching of polysilicon.

EXAMPLE 12

In the pattern formation apparatus by use of the selective irradiation light shown in FIG. 13, as the method for forming a predetermined pattern on the above sample substrate 1205, an Example of using surface modification and film formation in place of photoetching is described.

This Example is the case when a predetermined pattern is formed on the sample substrate 1205 by surface modification of obtaining $SiO_2$ from polysilicon.

As the sample substrate 1205, similarly as described in Example 11, one having an $SiO_2$ deposited to 200 Å on a silicon substrate and an $n^+$-polysilicon to 3000 Å thereon similarly as described in Example 11 was employed.

After the treatment vessel 1210 was internally evacuated to $10^{-6}$ or lower by the evacuation device 1206, $NO_2$ gas was introduced through the gas introducing pipe 1207. By controlling the above evacuation device 1206 a pressure within the above treatment vessel 1210 was set to 1.0 Torr, $NO_2$ was adsorbed to the above $n^+$-polysilicon surface. Then, a laser beam was vertically irradiated to the surface of the photomask 1204 from the light source 1208 comprising a KrF excimer laser and an optical system.

Here, for the light-transmissive substrate 1201 of the above photomask 1204 and the light-transmissive window 1209 of the above treatment vessel 1210, a quartz plate which does not absorb the above laser beam with the wavelength of 248 nm, but permits it to transmit therethrough was employed. For the light shielding pattern 1202 of the above photomask 1204, aluminum, and for the light absorbing member 1203, carbon were used, respectively.

When the above laser beam was irradiated for 10 minutes, a silicon oxide layer with a thickness of about 10 Å was formed on the $n^+$-polysilicon surface in the region irradiated with the laser beam of the above sample substrate 1205.

Also in the present Example, since the photomask 1204 shown in FIG. 12 was employed, the reflected light from the sample substrate 1205 was reflected at the photomask 1204 and was not returned again to the sample substrate 1205, whereby there was not an unfocused image at the edge portion of the silicon oxide layer and could be formed with a good precision following the predetermined pattern.

EXAMPLE 13

This Example is the case when forming a predetermined pattern on the sample substrate 1205 by film formation according to the optical CVD (Chemical Vapor Deposition) of Al.

As the sample substrate 1205, similarly as in Example 1 described above, one having $SiO_2$ laminated to 200 Å, and an $n^+$-polysilicon to 3000 Å thereon was employed.

After evacuation internally of the treatment vessel 1210 to $10^{-6}$ Torr or lower by the evacuation device 1206, $Al(CH_3)_3$ gas was introduced through the gas introducing pipe 1207 to control the above evacuation device 1206 so that the pressure in the above treatment vessel 1210 was to become 1.0 Torr. Then, a laser beam was irradiated vertically to the surface of the photomask 1204 from the light source 1208 comprising an $Ar^+$ laser and an optical system.

Here, for the light transmissive substrate 1201 of the above photomask 1204 and the light transmissive window 1209 of the above treatment vessel 1210, a quartz plate was employed. For the light-shielding pattern 1202 of the above photomask 1204, chromium, and for the light absorbing member 1203, carbon were respectively employed.

The precision of the Al pattern obtained on the sample substrate 1205 was better than the precision of the Al pattern when the Al pattern was prepared by use of the photomask 1224 of the prior art example similarly as in the case of Example 11 as described above.

EXAMPLE 14

When patterns were formed under the same conditions as in the above Examples 11 to 13 except for using the photomask of the present invention having the constitution shown in FIG. 15, predetermined patterns could be similarly formed with a good precision on the substrate.

The phototreatment apparatus of the present invention has a light source and a treatment vessel connected with a gas introducing pipe having a light transmissive window for transmitting the light emitted from the light source and an evacuation device. A photomask having a predetermined light-shielding pattern and a sample substrate are located in parallel and proximate to each other in the treatment vessel. After predetermined gases are introduced from outside through the gas introducing pipe into the treatment vessel to maintain the pressure within the treatment vessel at a predetermined value by the evacuation device, the sample substrate is selectively irradiated with a light through a light-transmissive window and the photomask to photoetch the region irradiated with the light of the sample substrate, thereby forming a predetermined pattern on the sample substrate. A light absorbing member absorbing the light and having the same pattern shape as the light-shielding pattern is formed on the surface confronted with the sample substrate of the photomask.

Also, in place of the region irradiated with the above light of the above sample substrate being subjected to photoetching, it may be subjected to surface modification or film formation.

What is claimed is:

1. A process for forming an etching pattern, comprising the steps of:
    selectively irradiating light to a clean surface of a material to be worked by etching, so as to form radicals from a photoradical forming substance in an atmosphere of the substance, the light having a wavelength not longer than the UV-ray absorption end of the photoradical forming substance;
    forming a modified portion having etching resistance at a photo-irradiated portion of the surface; and
    then subjecting an unmodified portion of the surface of the material to be worked to an etching treatment comprising dry etching using halogen atom radicals, thereby forming an etching pattern corresponding to a pattern formed by said light irradiation.

2. A process for forming an etching pattern according to claim 1, wherein the clean surface of said material to be worked by etching is formed by irradiating radicals obtained from at least one of the group consisting of hydrogen gas and inert gases to the surface of the material to be worked by etching.

3. A process for forming an etching pattern according to claim 1, wherein the clean surface of said material to be worked by etching forms the modified portion without exposing a thin film formed by a thin film forming method to air.

4. A process for forming an etching pattern according to claim 1, further comprising forming the clean surface of the material to be worked by etching by modifying the surface of a thin film formed by a thin film forming method by irradiating the thin film with one of hydrogen ions and fluorine ions.

5. A process for forming an etching pattern according to claim 1, wherein said photoradical forming substance is a substance for forming oxygen radicals.

6. A process for forming an etching pattern according to claim 5, wherein said photoradical forming substance is at least one substance selected from the group consisting of oxygen, ozone, nitrous oxide, carbon dioxide and nitrogen dioxide.

7. A process for forming an etching pattern accoridng to claim 1, wherein the surface of said material to be worked comprises at least one material selected from the group consisting of Al, Si, SiN, C, Ge, GaAs, Ti, Ta, Mo, W and Nb.

8. A process for forming an etching pattern according to claim 1, wherein said light irradiation is effected through a photomask.

9. A process for forming an etching pattern according to claim 1, wherein said dry etching is carried out by using at least one substance selected from the group consisting of $Cl_2$, $CF_3Cl$, $CCl_4$ and $NF_3$.

10. A process for forming an etching pattern according to claim 1, wherein said halogen atom radicals are selected from the group consisting of chlorine radicals and fluorine radicals.

11. A process for forming an etching pattern according to claim 8, wherein said photomask has a light shielding pattern and a light absorbing member provided corresponding to said light shielding pattern.

12. A process for forming an etching pattern according to claim 1, wherein the formation of said modified portion and said etching treatment are carried out in different treatment spaces.

13. A process for forming an etching pattern according to claim 12, further comprising moving the material to be worked between the different treatment spaces through a conveying chamber adjacent to each of the treatment spaces.

14. A process for forming an etching pattern according to claim 13, further comprising providing a gate valve between the conveying chamber and each of the treatment spaces.

15. A process for forming an etching pattern, comprising the steps of:
    providing a resist pattern of a polymerized film formed by a CVD method on a clean surface of a material to be worked by etching; and
    then subjecting the surface of the material to be worked having the resist pattern provided thereon to an etching treatment.

16. A process for forming an etching pattern according to claim 15, wherein the clean surface of said material to be worked by etching is formed by irradiating a plasma obtained from at least one selected from the group consisting of hydrogen gas and inert gases to the surface of the material to be worked by etching.

17. A process for forming an etching pattern according to claim 15, wherein the clean surface of said material to be worked by etching forms said resist pattern without exposing a thin film formed by a thin film forming method to air.

18. A process for forming an etching pattern according to claim 15, wherein the clean surface of said material to be worked by etching is formed by modifying the surface of a thin film formed by a thin film forming method by irradiating the thin film with one of hydrogen ion and fluorine ions.

19. A process for forming an etching pattern according to claim 15, wherein said step of providing a resist pattern comprises the steps of forming a polymerized film on the clean surface of the material to be worked by etching by a CVD method and selectively removing a desired portion of said polymerized film.

20. A process for forming an etching pattern according to claim 19, wherein the selective removal of the desired portion from the polymerized film is carried out by irradiating light to the desired portion of said polymerized film in an atmosphere of a photoradical forming substance, thereby causing decomposition to remove the polymerized film at a portion irradiated with the light by the generated radicals.

21. A process for forming an etching pattern according to claim 19, wherein the selective removal of the polymerized film at the desired portion is carried out by irradiating light capable of decomposing and removing said polymerized film by heat generation to the desired portion of said polymerized film.

22. A process for forming an etching pattern according to claim 20, wherein the photoradical forming substance is one forming oxygen radicals.

23. A process for forming an etching pattern according to claim 22, wherein the photoradical forming substance is at least one selected from the group consisting of oxygen, nitrogen dioxide, ozone, nitrous oxide and carbon dioxide.

24. A process for forming an etching pattern according to claim 15, wherein the polymerized film comprises a hydrocarbon compound of which at least a portion of the hydrogen thereof is substituted by at least one selected from the group consisting of fluorine and chlorine.

25. A process for forming an etching pattern according to claim 15, wherein said etching treatment is effected by using halogen element radicals.

26. A process for forming an etching pattern according to claim 15, wherein said etching treatment is a dry etching.

27. A process for forming an etching pattern according to claim 26, wherein said dry etching is carried out by using a compound capable of generating halide radicals.

28. A process for forming an etching pattern according to claim 27, wherein said halide radicals are selected from the group consisting of chlorine radicals and fluorine radicals.

29. A process for forming an etching pattern according to claim 27, wherein said compound is at least one selected from the group consisting of $Cl_2$, $CF_3Cl$, $CCl_4$ and $NF_3$.

30. A process for forming an etching pattern according to claim 20, wherein said light irradiation is effected through a photomask.

31. A process for forming an etching pattern according to claim 30, wherein said photomask has a light shielding pattern and a light absorbing member provided corresponding to said light shielding pattern.

32. A process for forming an etching pattern according to claim 15, wherein the formation of said resist pattern of the polymerized film and said etching treatment are carried out in different treatment spaces.

33. A process for forming an etching pattern according to claim 32, further comprising moving the material to be worked between the different treatment spaces through a conveying chamber adjacent to each of the treatment spaces.

34. A process for forming an etching pattern according to claim 33, further comprising providing a gate valve between the conveying chamber and each of the treatment spaces.

35. A process for forming an etching pattern according to claim 15, wherein the surface of said material to be worked comprises at least one material selected from the group consisting of Al, Si, Cr, Au, CdS, GaAs and Ge.

36. A process for forming a semiconductor device comprising the steps of:
cleaning a surface of a substrate;
depositing a film of one of a semiconductor, a metal and an insulator on the substrate cleaned in said cleaning;
forming a mask by irradiating the substrate with a selected light to form a desired device structure on the film deposited in said depositing step; and
effecting etching by using the mask formed in said forming step as a light shielding member,
wherein each of the cleaning, depositing, forming and etching steps are consistently carried out in a state shielded from air and under a reduced pressure.

37. A process for preparing a semiconductor device according to claim 36, wherein said selective light irradiating step is carried out in a reactive gas atmosphere to modify the surface of the film deposited on the substrate in said film depositing step.

38. A process for preparing a semiconductor device according to claim 36, wherein a photoetching by selective photo-irradiation is effected in place of said mask forming step and said photoetching step.

39. A process for forming a semiconductor device according to claim 36, wherein said cleaning step is carried out by irradiating radicals obtained from at least one of the group consisting of hydrogen gas and inert gases to the surface of the substrate.

40. A process for forming a semiconductor device according to claim 36, wherein said mask forming step is carried out in an atmosphere of a substance that forms photoradicals by irradiation with light for forming the photoradicals.

41. A process for forming a semiconductor device according to claim 40, wherein said substance that forms photoradicals is at least one substance selected from the group consisting of oxygen, ozone, nitrous oxide, carbon dioxide and nitrogen dioxide.

42. A process for forming a semiconductor device according to claim 36, wherein said etching step is performed by dry etching.

43. A process for forming a semiconductor device according to claim 42, wherein said etching step is carried out by using halogen atom radicals.

44. A process for forming a semiconductor device according to claim 36, wherein the surface of said substrate comprises at least one material selected from the group consisting of Al, Si, SiN, C, Ge, GaAs, Ti, Ta, Mo, W and Nb.

45. A process for forming a semiconductor device according to claim 36, wherein said mask forming step is carried out in an atmosphere of a substance that forms photoradicals by irradiation with light for forming the photoradicals, the light having a wavelength not longer than the UV-ray absorption end of said substance.

46. A process for forming a semiconductor device according to claim 42, wherein said dry etching is carried out by using at least one substance selected from the group consisting of $Cl_2$, $CF_3Cl$, $CCl_4$ and $NF_3$.

47. A process for forming a semiconductor device according to claim 36, wherein said halogen atom radicals are selected from the group consisting of chlorine radicals and fluorine radicals.

48. A process for forming a semiconductor device according to claim 36, wherein the light irradiation in said mask forming step is effected through a photomask having a light shielding pattern with a desired pattern.

49. A process for forming a semiconductor device according to claim 48, wherein said photomask further has a light absorbing member provided corresponding to said light shielding pattern.

* * * * *

UNITED STATES PATENT AND TRADEMARK OFFICE
CERTIFICATE OF CORRECTION

PATENT NO. : 5,344,522
DATED : September 6, 1994
INVENTOR(S) : Takayuki YAGI, et al.

It is certified that error appears in the above-indentified patent and that said Letters Patent is hereby corrected as shown below:

COLUMN 1:

Line 65, "been" should be deleted.

COLUMN 2:

Line 49, "reducting" should be deleted.

COLUMN 3:

Line 1, "Hottike:" should read --Horiike:--.

COLUMN 19:

Line 30, "wiring 1635," shoudl read --wiring 1637,--.

COLUMN 22:

Line 43, "amorhous" should read --amorphous--.

COLUMN 23:

Line 59, "amorhous" should read --amorphous--.

UNITED STATES PATENT AND TRADEMARK OFFICE
CERTIFICATE OF CORRECTION

PATENT NO. : 5,344,522
DATED : September 6, 1994
INVENTOR(S) : Takayuki YAGI, et al.

It is certified that error appears in the above-indentified patent and that said Letters Patent is hereby corrected as shown below:

COLUMN 25:

Line 53, "quarty" should read --quartz--; and
Line 56, "chamber 60 1" should read --chamber 601--.

COLUMN 27:

Line 51, "reaction was not proceeded," should read --a reaction did not occur,--.

COLUMN 29:

Line 61, "twice" should be deleted.

COLUMN 30:

Line 23, "invnetion," should read --invention,--; and
Line 50, "nega-related" should be deleted.

COLUMN 33:

Line 61, "accoridng" should read --according--.

UNITED STATES PATENT AND TRADEMARK OFFICE
CERTIFICATE OF CORRECTION

PATENT NO. : 5,344,522
DATED : September 6, 1994
INVENTOR(S) : Takayuki YAGI, et al.

It is certified that error appears in the above-indentified patent and that said Letters Patent is hereby corrected as shown below:

COLUMN 34:

Line 50, "ion" should read --ions--.

COLUMN 36:

Line 53, "$Cl_2$, $CF_3Cl$, $CCl_4$" should read --$Cl_2$, $CF_3Cl$, $CCl_4$--.

Signed and Sealed this

Ninth Day of May, 1995

BRUCE LEHMAN

Attest:

*Attesting Officer*   *Commissioner of Patents and Trademarks*